(12) United States Patent　　　　　(10) Patent No.: US 12,593,678 B2
Lee　　　　　　　　　　　　　　　　　(45) Date of Patent: Mar. 31, 2026

(54) MEMORY DEVICE AND METHOD FOR MANUFACTURING THE SAME

(71) Applicant: MACRONIX INTERNATIONAL CO., LTD., Hsinchu (TW)

(72) Inventor: Chih-Hsiung Lee, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 600 days.

(21) Appl. No.: 18/147,724

(22) Filed: Dec. 29, 2022

(65) Prior Publication Data

US 2024/0221831 A1　Jul. 4, 2024

(51) Int. Cl.
| | |
|---|---|
| *H10B 41/10* | (2023.01) |
| *H10B 41/27* | (2023.01) |
| *H10B 41/35* | (2023.01) |
| *H10B 41/50* | (2023.01) |
| *H10B 43/10* | (2023.01) |
| *H10B 43/27* | (2023.01) |
| *H10B 43/35* | (2023.01) |
| *H10B 43/50* | (2023.01) |
| *H10W 20/41* | (2026.01) |

(52) U.S. Cl.
CPC .......... *H10W 20/435* (2026.01); *H10B 41/10* (2023.02); *H10B 41/27* (2023.02); *H10B 41/35* (2023.02); *H10B 41/50* (2023.02); *H10B 43/10* (2023.02); *H10B 43/27* (2023.02); *H10B 43/35* (2023.02); *H10B 43/50* (2023.02)

(58) Field of Classification Search
CPC .................... H10B 41/10; H10B 41/27; H10B 41/35; H10B 41/50; H10B 43/10; H10B 43/27; H10B 43/35; H10B 43/50; H10W 20/435; G11C 16/0483; H01L 23/5283
See application file for complete search history.

(56) References Cited

U.S. PATENT DOCUMENTS

| | | | | |
|---|---|---|---|---|
| 10,672,780 B1 * | 6/2020 | Kawamura | ............ | H10B 43/27 |
| 11,417,621 B2 * | 8/2022 | Hosoda | ................... | H01L 25/18 |
| 2020/0185408 A1 * | 6/2020 | Song | ...................... | H10B 43/50 |
| 2021/0358937 A1 * | 11/2021 | Yamaguchi | ............ | H10B 43/27 |
| 2022/0077167 A1 * | 3/2022 | Lim | | |
| 2022/0130854 A1 * | 4/2022 | Kong | ...................... | H10B 41/10 |
| 2022/0157846 A1 * | 5/2022 | Zhang | ..................... | H10B 41/27 |
| 2022/0310645 A1 | 9/2022 | Ikedo | | |

(Continued)

*Primary Examiner* — Christine S. Kim
*Assistant Examiner* — Tien Tran
(74) *Attorney, Agent, or Firm* — McClure, Qualey & Rodack, LLP

(57) ABSTRACT

A memory device includes a stacked structure having an array region and a staircase region adjacent to the array region, a lower isolation structure in the stacked structure, two memory strings in the array region and at least one lower support member in the staircase region. The stacked structure includes conductive layers. The lower isolation structure has an upper surface in a lower portion of the stacked structure, extends from the array region to the staircase region and separates one conductive layer into a first conductive strip and a second conductive strip electrically isolated from each other and electrically connected to two memory strings respectively. A material of the lower support member is the same as a material of the lower isolation structure, and a height of the lower support member is the same as a height of the lower isolation structure.

13 Claims, 20 Drawing Sheets

(56) References Cited

U.S. PATENT DOCUMENTS

| | | | | |
|---|---|---|---|---|
| 2023/0413548 A1* | 12/2023 | Cheng | .................... | H10B 43/27 |
| 2024/0395705 A1* | 11/2024 | Liao | ....................... | H10B 43/27 |
| 2025/0098162 A1* | 3/2025 | Liao | ....................... | H10B 41/10 |

* cited by examiner

MEMORY DEVICE AND METHOD FOR MANUFACTURING THE SAME

BACKGROUND

Technical Field

The disclosure relates to a memory device and a method for manufacturing the same, and more particularly to a three-dimensional memory device and a method for manufacturing the same.

Description of the Related Art

Recently, as the demand for more superior memory devices has gradually increased, various three-dimensional (3D) memory devices have been provided, such as a three-dimensional NAND (3D NAND) memory device having a multi-layer stack structure. Such three-dimensional memory devices can achieve higher storage capacity and have more excellent electrical properties, such as good data retention reliability and operation speed. However, the process for manufacturing the memory devices becomes more difficult as the storage density and integration of 3-dimensional memory devices increases, and the yield may be decreased. Therefore, it is desirable to provide improved memory devices and methods for manufacturing memory devices that can increase the yield of memory devices.

SUMMARY

The present disclosure relates to a memory device including a lower support member and a method for manufacturing the same, which may improve the problems for lacking of the supporting force during manufacturing the memory devices, and further increase the yield.

According to an embodiment of the present disclosure, a memory device is provided. A memory device is provided. The memory device includes a stacked structure having an array region and a staircase region adjacent to the array region, a lower isolation structure in the stacked structure, and two memory strings in the array region of the stacked structure and at least one lower support member in the staircase region of the stacked structure. The stacked structure includes conductive layers. The lower isolation structure has an upper surface in a lower portion of the stacked structure. The lower isolation structure extends from the array region to the staircase region. The lower isolation structure separates at least one conductive layer of the conductive layers into a first conductive strip and a second conductive strip. The first conductive strip and the second conductive strip are electrically isolated from each other. Two memory strings are electrically connected to the first conductive strip and the second conductive strip respectively.

According to another embodiment of the present disclosure, a method for manufacturing a memory device is provided. The method includes the following steps: forming a layer stack along a first direction on a bottom plate, wherein the layer stack includes an array region and a staircase region adjacent to the array region; forming a lower isolation structure and at least one lower support member in the layer stack, the lower isolation structure and the at least one lower support member extend downward toward the bottom plate, wherein the lower isolation structure extends from the array region along a second direction different from the first direction to the staircase region, the at least one lower support member is formed in the staircase region, a material of the at least one lower support member is the same as a material of the lower isolation structure, and a height of the at least one lower support member is the same as a height of the lower isolation structure; and forming an insulating stacked structure on the layer stack, wherein the lower isolation structure and the at least one lower support member are under the insulating stacked structure.

The above and other embodiments of the disclosure will become better understood with regard to the following detailed description of the non-limiting embodiment(s). The following description is made with reference to the accompanying drawings.

DETAILED DESCRIPTION

Figure 1:
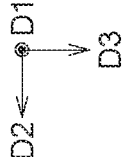
FIG. 1 illustrates a schematic top view of a memory device according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

The ordinal numbers such as "first", "second", "third" and other terms used in the detailed description and the claims are for modifying the element, which itself does not imply and represent that the element has any previous ordinal numbers, does not represent the order of a certain element and another element, or the order of the manufacturing method. The use of these ordinal numbers is only used to enable an element with a certain name can be clearly distinguished from another element having the same name.

The embodiments of the present disclosure could be implemented in many different 3D stacked memory structures in the applications. For example, the embodiment could be applied to, but not limited to, 3D NAND flash memory devices.

Figure 2A:
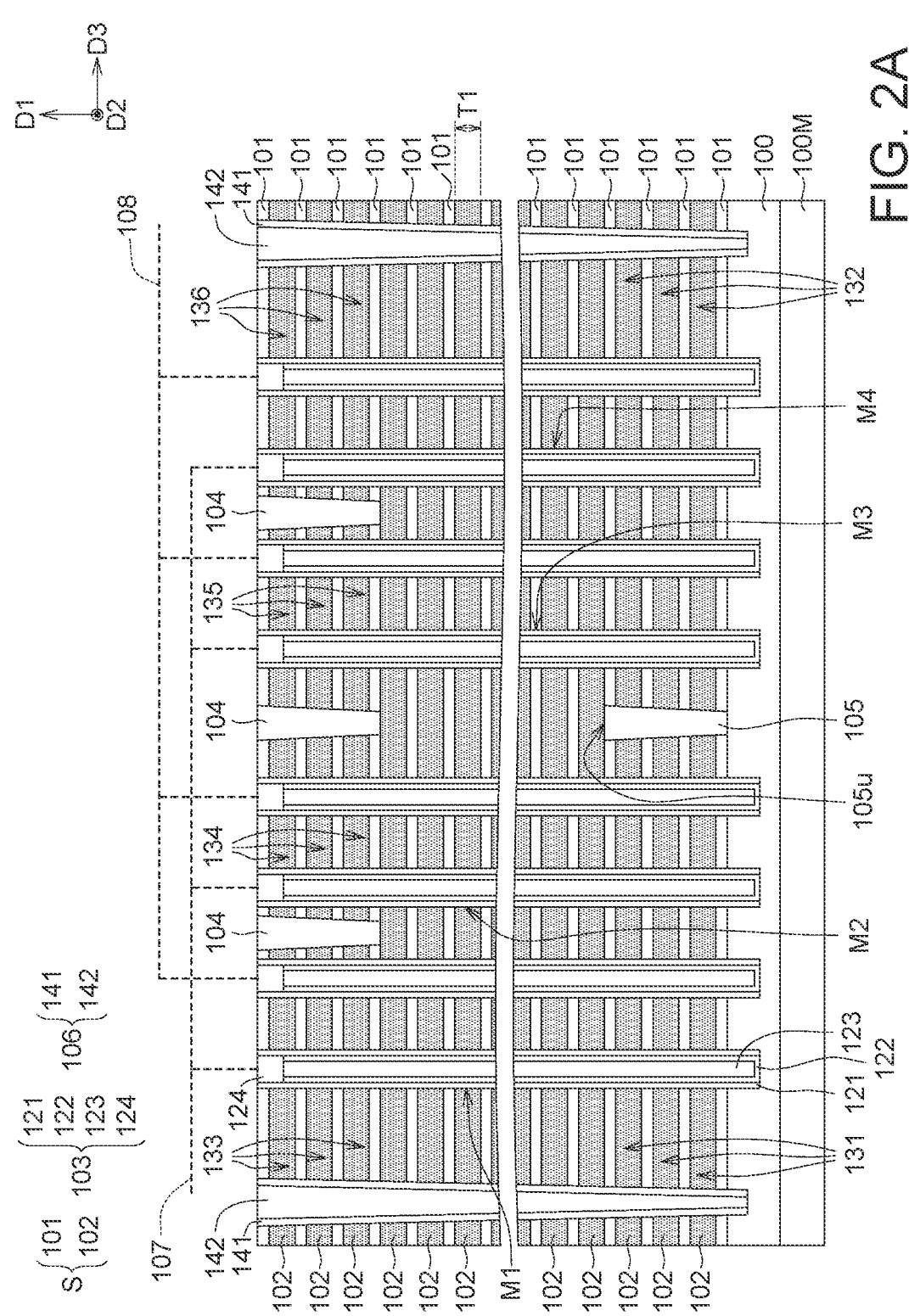
FIG. 2A illustrates a cross-section view of the memory device taken along a line P1 in FIG. 1.
Figure 2B:
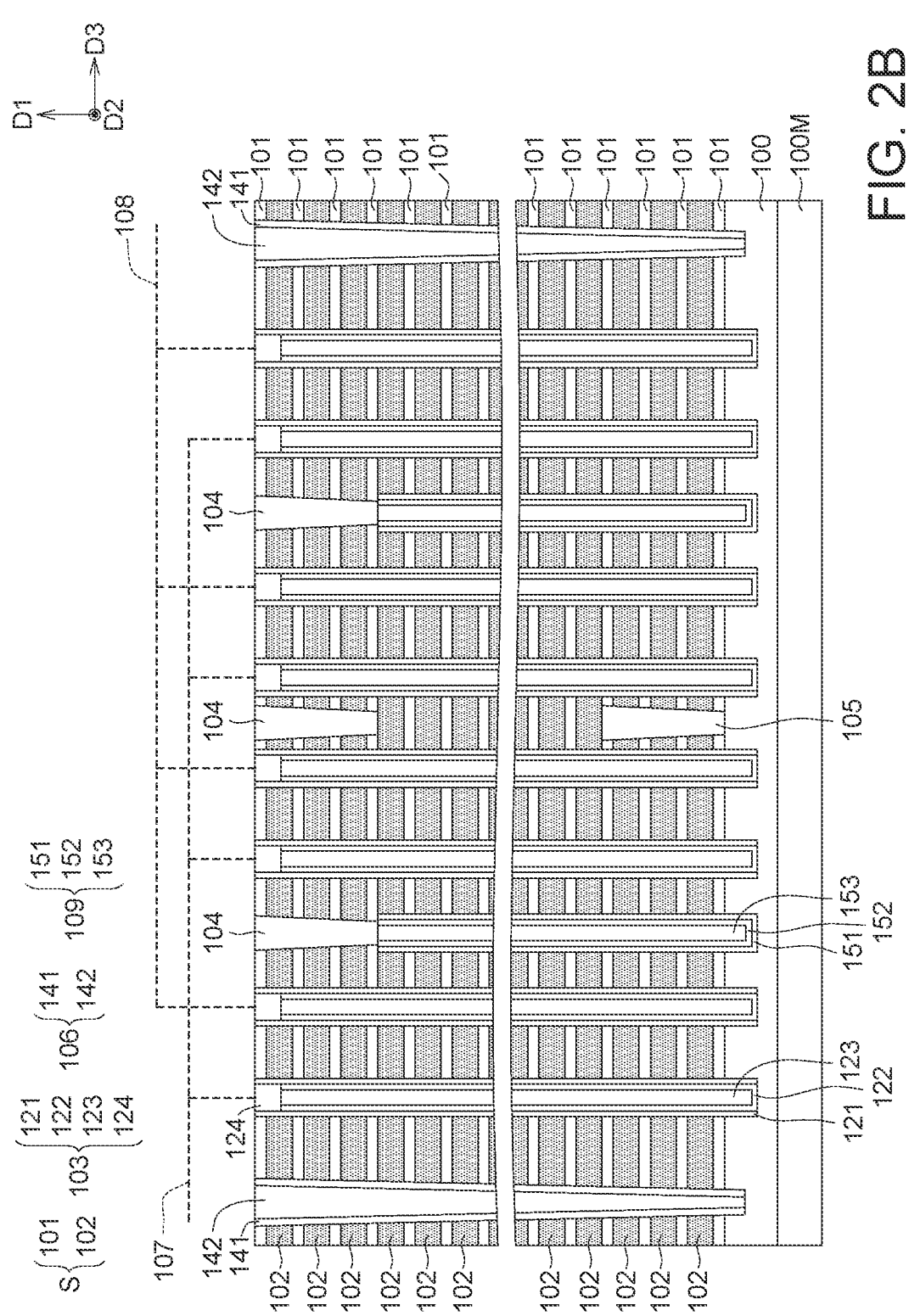
FIG. 2B illustrates a cross-section view of the memory device taken along a line P1-1 in FIG. 1.
Figure 2C:
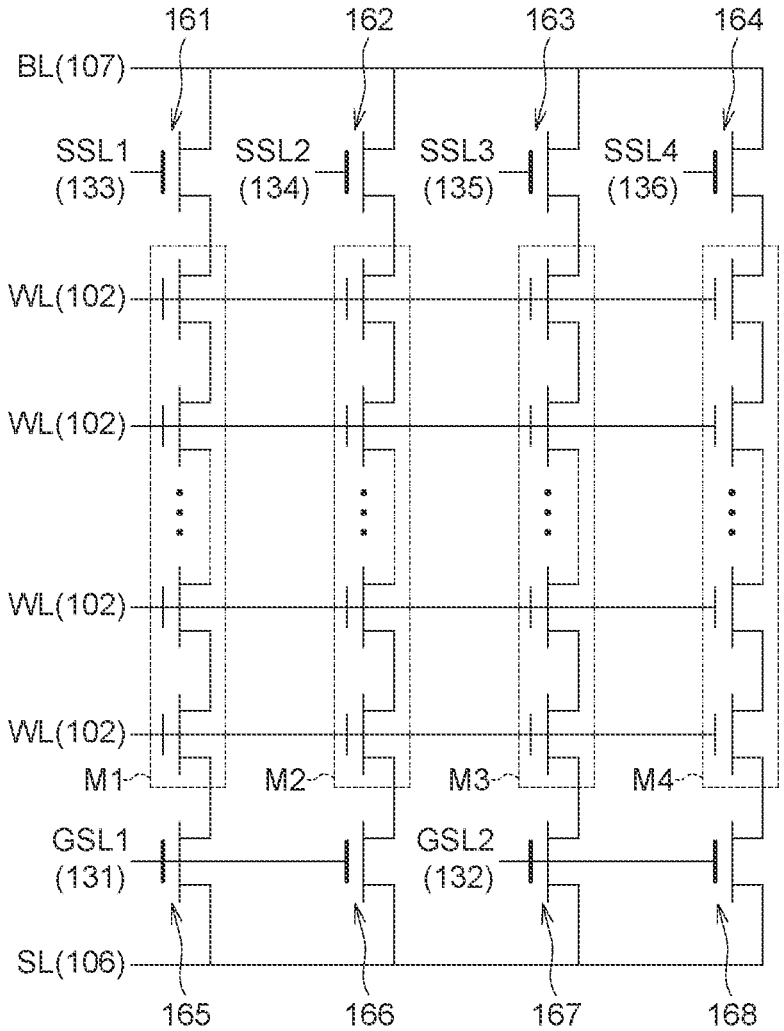
FIG. 2C illustrates an equivalent circuit diagram of a memory device according to an embodiment of the present disclosure.

FIG. 1 is a schematic top view of a memory device 10 according to an embodiment of the present disclosure. As shown in FIG. 1, a stacked structure S (shown in FIGS. 2A-2B and 2D-2E) of the memory device 10 has an array region AR and a staircase region SR adjacent to the array area AR. FIGS. 2A to 2C are mainly used to describe the array region AR. FIGS. 2D to 2G are mainly used to describe the staircase region SR.

Referring to FIGS. 1 and 2A, FIG. 2A illustrates a cross-section view of the memory device 10 taken along a line P1 in FIG. 1. The memory device 10 may include a bottom plate 100, a stacked structure S, pillar elements 103, at least one upper isolation structure 104, at least one lower isolation structure 105 and isolation elements 106.

The stacked structure S is over the bottom plate 100. The stacked structure S may include insulating layers 101 and conductive layers 102 stacked alternately along a first direction D1. The first direction D1, the second direction D2 and the third direction D3 may be perpendicular to each other. The first direction D1 may be a normal direction to an upper surface of the bottom plate 100. The first direction D1 may be a Z direction, the second direction D2 may be an X direction, and the third direction D3 may be a Y direction. The conductive layers 102 are separated from each other by the insulating layers 101. For clarity, FIG. 2A does not show all of the layers in the stacked structure S. The number of layers of the stacked structure S can be adjusted as needed. In an embodiment, the conductive layers 102 of the stacked structure S has a thickness T1 in the first direction D1, and the thickness T1 is about 200-350 angstroms (Å).

The pillar elements 103 are arranged apart in the stacked structure S. The pillar elements 103 may extend along the first direction D1 and pass through the stacked structure S. The pillar element 103 may include a memory layer 121, a channel layer 122, an insulating pillar 123 and a pad 124. The memory layer 121 may enclose the channel layer 122. The memory layer 121 may have a tubular shape, for example, the memory layer 121 may have a tubular shape with one open end and one closed end. The channel layer 122 may be between the memory layer 121 and the insulating pillar 123. The channel layer 122 may enclose the insulating pillar 123. The channel layer 122 may have a tubular shape, for example, the channel layer 122 may have a tubular shape with one open end and one closed end. A lower portion of the memory layer 121 is removed to expose a portion of the channel layer 122. The exposed portion of the channel layer 122 is electrically connected to the bottom plate 100. In another example, the memory layer 121 may have a tubular shape with two open ends. A bottom portion of the memory layer 121 is removed to expose a portion of the channel layer 122. The exposed portion of the channel layer 122 is electrically connected to the bottom plate 100. The pad 124 may be on the channel layer 122 and the insulating pillar 123. The pad 124 may be enclosed by the memory layer 121. The pad 124 may be electrically connected to the channel layer 122.

At least one upper isolation structure 104 is in the stacked structure S. The upper isolation structure 104 may extend along the first direction D1 and pass through one or more insulating layers 101 and/or one or more conductive layers 102 of the stacked structure S. For example, in the embodiment shown in FIG. 2A, the upper isolation structure 104 may be disposed in an upper portion of the stacked structure S, and passing through four insulating layers 101 and three conductive layers 102 in the upper portion of the stacked structure S. Specifically, the upper isolation structures 104 pass through three conductive layers 102 farthest from the bottom plate 100 among the conductive layers 102, and separate each of the three conductive layers 102 into conductive strips 133, 134, 135 and 136. The conductive strips 133, 134, 135 and 136 are electrically isolated from each other. For example, the upper isolation structures 104 may separate 3-7 conductive layers 102 in the upper portion of the stacked structure S.

At least one lower isolation structure 105 is in the stacked structure S. The lower isolation structure 105 may extend along the first direction D1 and pass through one or more insulating layers 101 and/or one or more conductive layers 102 of the stacked structure S. For example, in the embodiment shown in FIG. 2A, the lower isolation structure 105 may be disposed in a lower portion of the stacked structure S, and passing through four insulating layers 101 and three conductive layers 102 in the lower portion of the stacked structure S. The lower isolation structure 105 may have an upper surface 105$u$ in the lower portion of the stacked structure S. In one example, the lower isolation structure 105 may extend from upper surface 105$u$ to the bottom plate 100. The lower isolation structure 105 passes through at least three conductive layers 102 closest to the bottom plate 100 among the conductive layers 102, and separates each of the at least three conductive layers 102 into conductive strips 131 and 132. The conductive strip 131 (for example, a first conductive strip) and the conductive strip 132 (for example, a second conductive strip) may be on opposite sides of the lower isolation structure 105. The conductive strips 131 and 132 are electrically isolated from each other. In an embodiment, the lower isolation structure 105 may separate at least three conductive layers 102 in the lower portion of the stacked structure S. For example, the lower isolation structure 105 may separate 3-10 conductive layers 102 in the lower portion of the stacked structure S.

In this embodiment, the number of the upper isolation structures 104 is more than that of the lower isolation structures 105, and one of the upper isolation structures 104 may at least partially overlap the lower isolation structure 105 in the first direction D1. In one embodiment, the projection position of the lower isolation structure 105 in the array region AR may roughly align with a projection position of one of the upper isolation structures 104 in a plane containing the second direction D2 and the third direction D3; for example, in FIG. 1, the lower isolation structure 105 that roughly align with one of the upper isolation structures 104 is indicated by dashed lines.

The isolation elements 106 are arranged apart in the stacked structure S. As shown in FIG. 1, the isolation element 106 may be a stripe extending along the second direction D2. As shown in FIG. 2B, the isolation element 106 may extend along the first direction D1 and pass through the stacked structure S. The isolation elements 106 may include an isolation film 141 and a conductive film 142. The isolation film 141 may be between the conductive film 142 and the stacked structure S. The isolation film 141 may be used to electrically isolate the conductive film 142 from the conductive layers 102. A bottom portion of isolation film 141 is removed to expose a portion of conductive film 142. The exposed portion of the conductive film 142 is electrically connected to the bottom plate 100. The isolation element 106 may be functioned as a source line, such as a common source line.

The memory device 10 may further include a plurality of memory strings in the stacked structure S of the array region AR. Each of the plurality of memory strings may include memory cells arranged along the first direction D1. The memory cells may be defined in the memory layer 121 at intersections between the conductive layers 102 and the channel layer 122 of the pillar element 103. It should be noted that four memory strings M1, M2, M3 and M4 are shown in FIGS. 1 and 2A for convenience of discussion, but, in practice, a memory device can include more memory strings. The memory string M1 may share the channel layer 122 of the pillar element 103 where the memory string M1 is located. The conductive strip 131 and the conductive strip 133 can electrically control the memory string M1. The memory string M2 may share the channel layer 122 of the pillar element 103 where the memory string M2 is located. The conductive strip 131 and the conductive strip 134 can electrically control the memory string M2. The memory string M3 may share the channel layer 122 of the pillar element 103 where the memory string M3 is located. The conductive strip 132 and the conductive strip 135 can electrically control the memory string M3. The memory string M4 may share the channel layer 122 of the pillar element 103 where the memory string M4 is located. The conductive strip 132 and the conductive strip 136 can electrically control the memory string M4.

In an embodiment, the memory device 10 may include at least one string selection line and at least one ground selection line electrically connected to opposite ends of the memory string. For example, the three conductive layers 102 farthest from the bottom plate 100 (the conductive strips 133, 134, 135 and 136) among the conductive layers 102 of the memory device 10 may be functioned as string selection lines for memory strings. The memory cells defined in the memory layers 121 at intersections between the conductive strips 133, 134, 135 and 136 and the channel layers 122 of the pillar elements 103 may be functioned as string selection transistors. The three conductive layers 102 closest to the bottom plate 100 (the conductive strips 131 and 132) among the conductive layers 102 of the memory device 10 may be functioned as ground selection lines for memory strings. The memory cells defined in the memory layers 121 at intersections between the conductive strips 131, 132 and the channel layers 122 of the pillar elements 103 may be functioned as ground selection transistors. The other conductive layers 102 in the memory device 10 (for example, the conductive layers 102 not separated by the upper isolation structure 104 and the lower isolation structure 105) may be functioned as word lines. In the memory device 10, the conductive layers 102 functioned as string selection lines are separated into conductive strips 133, 134, 135 and 136 by the upper isolation structures 104. The conductive strips 133, 134, 135 and 136 are electrically isolated from each other. Therefore, the string selection transistors electrically connected to the memory strings M1, M2, M3 and M4 respectively can be controlled individually through different string selection lines. In the memory device 10, the conductive layers 102 functioned as ground selection lines are separated into conductive strips 131 and 132 by the lower isolation structures 105. The conductive strips 131 and 132 are electrically isolated from each other. Therefore, the ground selection transistors electrically connected to the memory strings M1 and M2 respectively can be controlled through one ground selection line. The ground selection transistors electrically connected to the memory strings M3 and M4 respectively can be controlled through the other ground selection line.

The memory device 10 may further include at least one first upper conductive structure 107 and at least one second upper conductive structure 108 above the stacked structure S. The first upper conductive structure 107 and the second upper conductive structure 108 may be electrically connected to the channel layer 122 and the pad 124 of the different pillar elements 103, respectively. In this embodiment, the first upper conductive structure 107 and the second upper conductive structure 108 are disposed on eight pillar elements 103 arranged in the third direction D3 (as shown in FIG. 1). The first upper conductive structure 107 is electrically connected to the channel layers 122 of four of these eight pillar elements 103 (as shown in FIG. 2A) and the memory strings M1, M2, M3 and M4. The second upper conductive structure 108 is electrically connected to the channel layers 122 of the other four of these eight pillar elements 103 (indicated by dashed lines in FIG. 2A) and the other memory strings. The first upper conductive structure 107 and the second upper conductive structure 108 may be functioned as bit lines.

In an embodiment, the memory device 10 may include blocks separated from each other by isolation elements 106. Each block may include sub-blocks separated from each other by the upper isolation structures 104. The operations, such as read operations, erase operations, etc., of the memory device 10 can be performed by sub-blocks.

FIG. 2B illustrates a cross-section view of the memory device 10 taken along a line P1-1 in FIG. 1. In an embodiment, the memory device 10 may include tubular elements 109 arranged apart in the stacked structure S. The tubular element 109 may extend along the first direction D1 and pass through the stacked structure S. The tubular element 109 may be under the upper isolation structure 104. Further, a portion of the tubular elements 109 may pass through the lower isolation structure 105, so that the lower isolation structure 105 discontinuously extends in the array region AR along the second direction D2. The tubular element 109 may include a memory layer 151, a dummy channel layer 152 and an insulating pillar 153. The memory layer 151 may enclose the dummy channel layer 152. The memory layer 151 may have a tubular shape, for example, the memory layer 151 may have a tubular shape with one open end and one closed end. The dummy channel layer 152 may be between the memory layer 151 and the insulating pillar 153. The dummy channel layer 152 may enclose the insulating pillar 153. The dummy channel layer 152 may have a tubular shape, for example, the dummy channel layer 152 may have a tubular shape with one open end and one closed end. The memory layer 151 of the tubular element 109 may be similar to the memory layer 121 of the pillar element 103. The insulating pillar 153 of the tubular element 109 may be similar to the insulating pillar 123 of the pillar element 103. In an embodiment, the dummy channel layer 152 may mean that the dummy channel layer 152 has no drive circuitry. In an embodiment, the dummy channel layer 152 may be understood as an electrically floating element.

In an embodiment, the memory device 10 may further include a circuit board 100M. The circuit board is disposed under the array region AR, and the circuit board 100M may include a control circuit MT (shown in FIG. 2D) (such as CMOS logic circuits) to form a CMOS under array (CuA) architecture. However, the present disclosure is not limited thereto. In one embodiment, the control circuit (such as CMOS logic circuits) may be disposed in a periphery region of array region AR to form a CMOS next to array (CnA) architecture. In an embodiment, the control circuitry, such as CMOS logic circuits, may be bonded to the array region AR to form a CMOS bonded array (CbA) architecture.

Referring to FIG. 2C, FIG. 2C illustrates an equivalent circuit diagram of the memory strings M1, M2, M3 and M4 of the memory device 10 in FIG. 2A. In FIG. 2A, each of the memory strings M1, M2, M3 and M4 is electrically connected to respective three string selection lines. The memory strings M1 and M2 and three ground selection lines are connected. The memory strings M3 and M4 and the other three ground selection lines are connected. However, for simplicity, only one end of each of memory strings (M1, M2, M3 and M4) respectively connected to one string selection line is shown in FIG. 2C. The other ends of memory strings M1 and M2 are connected to one ground selection line. The other ends of memory strings M3 and M4 are connected to another ground selection line.

A plurality of word lines WL (for example, the conductive layers 102) are electrically connected to the memory strings M1, M2, M3 and M4. The memory strings M1, M2, M3 and M4 are electrically connected between a bit line BL (for example, the first upper conductive structure 107) and a source line SL.

A string selection line SSL1 (for example, the conductive strip 133) and a ground selection line GSL1 (for example, the conductive strip 131) are electrically connected to opposite ends of the memory string M1. The string selection line SSL1 is electrically connected between the bit line BL and the memory string M1, and a string selection transistor 161 can be defined at an intersection between the string selection line SSL1 and the memory string M1. The ground selection line GSL1 is electrically connected between the source line SL and the memory string M1, and a ground selection transistor 165 can be defined at an intersection between the ground selection line GSL1 and the memory string M1. A string selection line SSL2 (for example, the conductive strip 134) and a ground selection line GSL1 (for example, the conductive strip 131) are electrically connected to opposite ends of the memory string M2. The string selection line SSL2 is electrically connected between the bit line BL and the memory string M2, and a string selection transistor 162 can be defined at an intersection between the string selection line SSL2 and the memory string M2. The ground selection line GSL1 is electrically connected between the source line SL and the memory string M2, and a ground selection transistor 166 can be defined at an intersection between the ground selection line GSL1 and the memory string M2. A string selection line SSL3 (for example, the conductive strip 135) and a ground selection line GSL2 (for example, the conductive strip 132) are electrically connected to opposite ends of the memory string M3. The string selection line SSL3 is electrically connected between the bit line BL and the memory string M3, and a string selection transistor 163 can be defined at an intersection between the string selection line SSL3 and the memory string M3. The ground selection line GSL2 is electrically connected between the source line SL and the memory string M3, and a ground selection transistor 167 can be defined at an intersection between the ground selection line GSL2 and the memory string M3. A string selection line SSL4 (for example, the conductive strip 136) and a ground selection line GSL2 (for example, the conductive strip 132) are electrically connected to opposite ends of the memory string M4. The string selection line SSL4 is electrically connected between the bit line BL and the memory string M4, and a string selection transistor 164 can be defined at an intersection between the string selection line SSL4 and the memory string M4. The ground selection line GSL2 is electrically connected between the source line SL and the memory string M4, and a ground selection transistor 168 can be defined at an intersection between the ground selection line GSL2 and the memory string M4.

During a read operation of the memory device 10 shown in FIG. 2C, for example, a read operation that accesses a selected memory cell on the memory string M1, a voltage is applied to the string selection line SSL1 electrically connected to the memory string M1 to turn on the string selection transistor 161 electrically connected to the string selection line SSL1, and a voltage is applied to the ground selection line GSL1 electrically connected to the memory string M1 to turn on the ground selection transistor 165 electrically connected to the ground selection line GSL1. Since the memory string M1 and the memory string M2 are both electrically connected to the ground selection line GSL1, the ground selection transistor 166 electrically connected to the memory string M2 would be turned on during this read operation.

During this read operation, the memory string M3 and the memory string M4 are not electrically connected to the ground selection line GSL1, the ground selection transistor 167 electrically connected to the memory string M3 and the ground selection transistor 168 electrically connected to the memory string M4 can remain off, and no capacitance is generated in the channel layers 122 electrically connected to the memory string M3 and the memory string M4. In an embodiment, the channel layers 122 electrically connected to the memory string M3 and the memory string M4 can be in an electrically floating state.

Referring back to FIG. 1, the upper isolation structure 104, the lower isolation structure 105 and the isolation element 106 may extend from the array region AR to the staircase region SR along the second direction D2. In one implementation, the lower isolation structure 105 and the isolation element 106 may extend to the end of the staircase region SR (i.e., the end of the staircase region SR farthest from the array region AR), and the upper isolation structure 104 may extend to and stop at a portion of the staircase region SR, The staircase region SR includes a first region R1, a second region R2, and a third region R3. The second region R2 is disposed between the first region R1 and the third region R3, and the third region R3 is more adjacent to the array region AR in comparison with the first region R1. The upper isolation structure 104 extends from the array region AR along the second direction D2, passes through the third region R3 of the staircase region SR, and stops in the second region R2 without passing through the second region R2. The lower isolation structure 105 and the isolation element 106 pass through the first region R1, the second region R2 and the third region R3. That is, a length of the lower isolation structure 105 and a length of the isolation element 106 in the second direction D2 are greater than a length of the upper isolation structure 104 in the second direction D2. According to an embodiment, in the staircase region SR, a portion of the lower isolation structure 105 may overlap the corresponding upper isolation structure 104 in the first direction D1, and another portion of the lower isolation structures 105 may not overlap the corresponding upper isolation structures 104 in the first direction D1 (i.e., separating from the upper isolation structure 104).

Figure 2D:
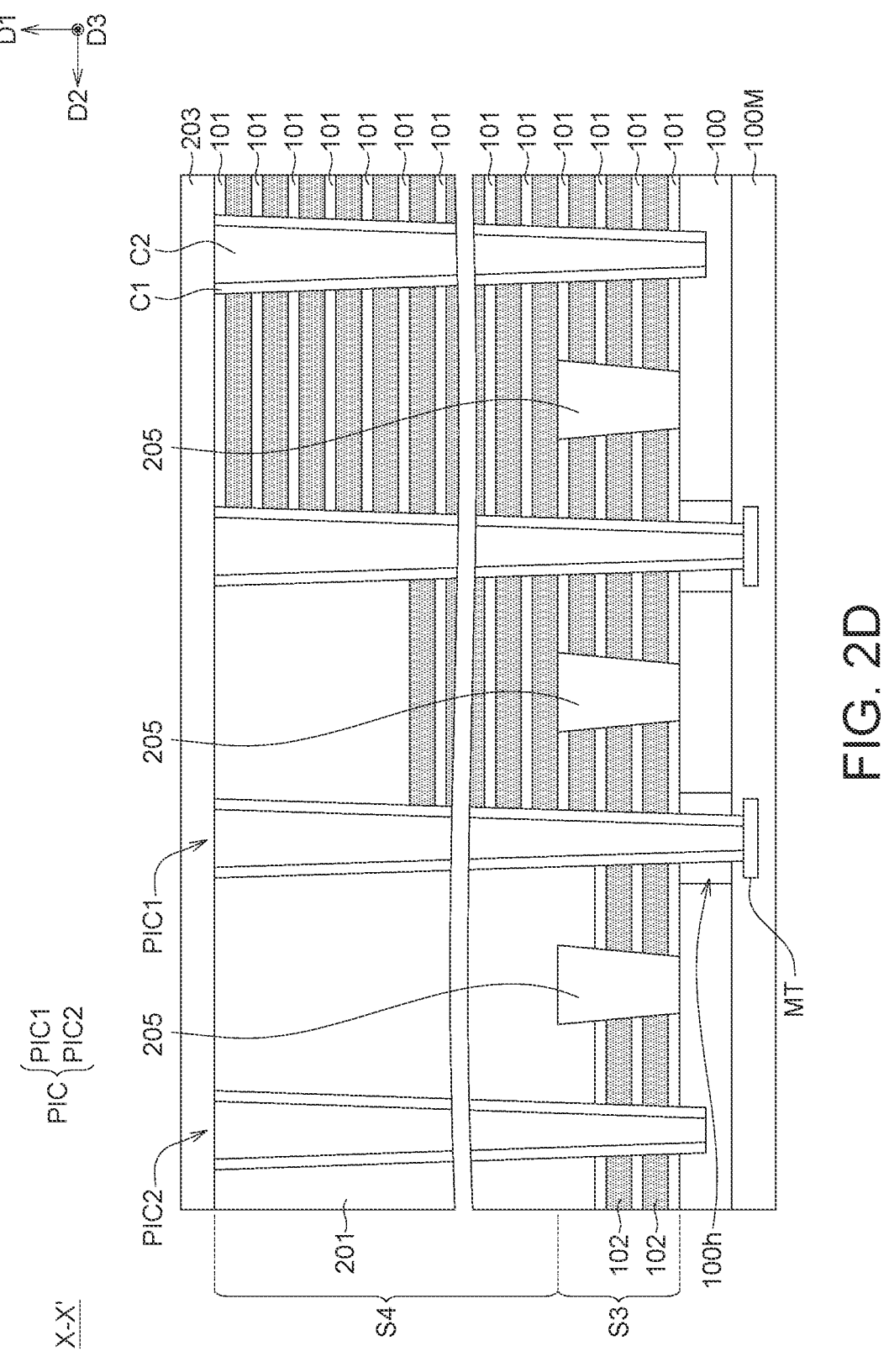
FIG. 2D illustrates a cross-section view of the memory device taken along a line X-X' in FIG. 1.
Figure 2E:
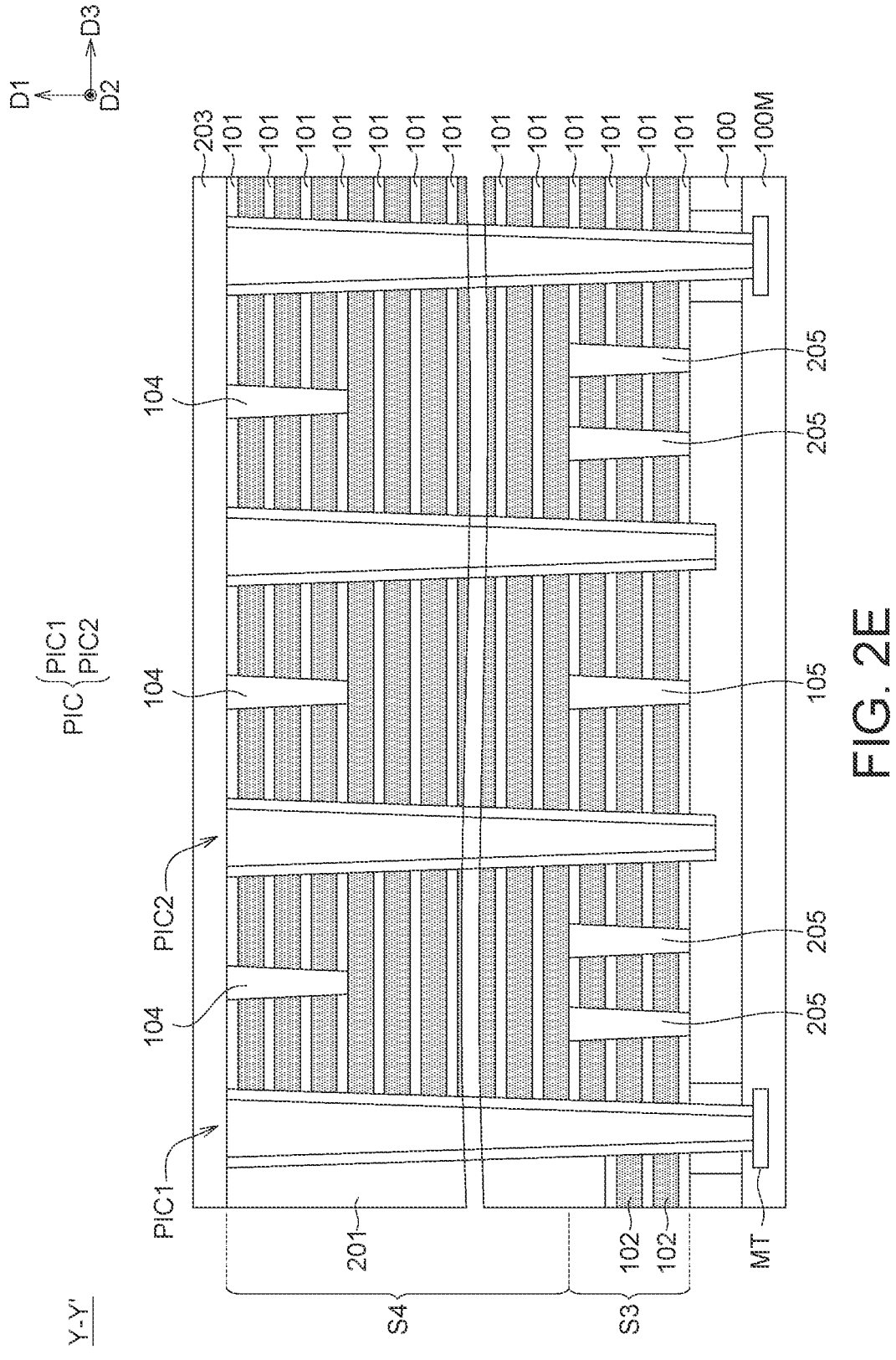
FIG. 2E illustrates a cross-section view of the memory device taken along a line Y-Y' in FIG. 1.

Please also refer to FIGS. 1 and 2D~2E. FIG. 2D illustrates a cross-section view of the memory device 10 taken along a X-X' line in FIG. 1. FIG. 2E is a cross-sectional view of the memory device 10 taken along the line Y-Y' in FIG. 1. The memory device 10 may further include at least a lower support member 205 and a plurality of vertical support members PIC. The lower support members 205 are arranged apart in the staircase regions SR of the stacked structure S, wherein a material of the lower support members 205 is the same as a material of the lower isolation structure 105. As shown in FIG. 2E, a height of the lower support member 205 is the same as a height of the lower isolation structure 105. For example, a top surface of the lower support member 205 and a top surface of the lower isolation structure 105 may be coplanar (e.g., in a plane formed by the second direction D2 and the third direction D3). In this embodiment, the lower support member 205 has a rectangular cross-section on the plane formed by the second direction D2 and the third direction D3. However, the present invention is not limited thereto, and the cross-section of the lower support member 205 may be circular, oval, triangle or other suitable shape.

As shown in FIGS. 1 and 2D-2E, the vertical support members PIC are arranged apart in the staircase region SR, and pass through the stacked structure S along the first direction D1. Each of vertical support members PIC may include a conductive pillar C2 and an insulating liner C1 surrounding the conductive pillar C2. The vertical support members PIC may include functional support members PIC1 and dummy support members PIC2. In detail, a portion of the vertical support members PIC pass through the bottom plate 100 and are electrically connected to the corresponding control circuit MT in the circuit board 100M to form functional support members PIC1; the other portions of the vertical support members PIC have bottoms stopped at the bottom plate 100 without passing through the bottom plate 100 to form a plurality of dummy support members PIC2. In other words, the dummy support members PIC2 are electrically floating. Some holes 100h corresponding to the functional support members PIC1 may pass through the bottom plate 100. An insulating material may be filled into the holes 100h and surrounds the functional support members PIC1.

In the present embodiment, the number of the lower support members 205 may be plural, and the lower support members 205 are disposed between the vertical support members PIC. A length of the lower support member 205 in the second direction D2 is smaller than a length of the lower isolation structure 105 in the second direction D2. In the gate replacement process for forming the memory device 10 (details will be described later), a plurality of spaces will be formed between the plurality of insulating layers 101, so that the overall structure of the memory device is relatively fragile. The lower support members 205, the vertical support members PIC and the lower isolation structures 105 can provide the supporting force for the overall structure in the staircase region SR, so as to avoid deformation or collapse of the insulating layers 101, thereby preventing the problem of deformation of the word lines to be filled later, and effectively improving the yield of the process. In the comparative example without the lower support members 205, the gaps between the vertical support members PIC are still relatively large, especially the larger the gaps between the lower support member PIC may be generated as closer to the bottom plate 100, and the supporting force provided by the vertical support members PIC may still be insufficient. In the present embodiment, since the lower support members 205 are further provided in the staircase region SR, the lower support members 205 can be distributed in the gaps between the vertical support members PIC, so more supporting force can be provided in comparison with the comparative example without the lower support members 205, and deformation or collapse of the insulating layers 101 and the word lines can be prevented, and the process yield can be improved. In addition, since the lower support members 205 and the lower isolation structure 105 can be formed under the same process, no additional process steps are required to improve the supporting force, which saves time and cost.

Figures 2F, 2G:
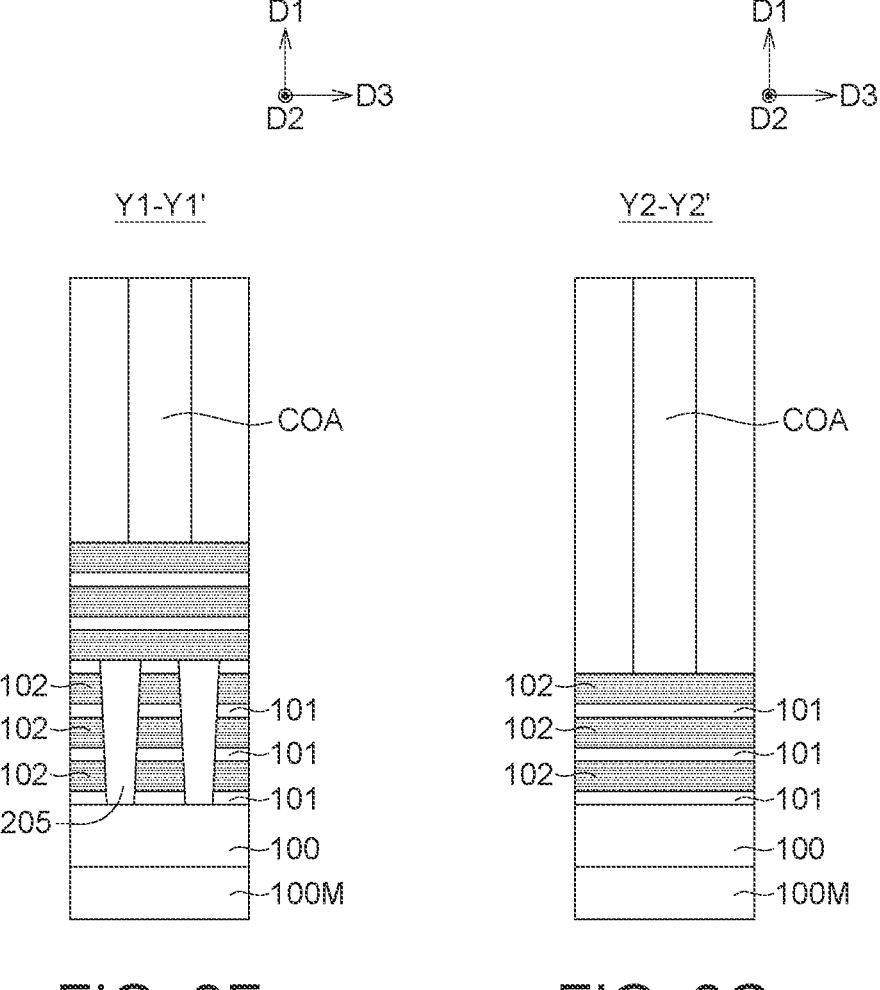
FIG. 2F illustrates a cross-section view of the memory device taken along a line Y1-Y1' in FIG. 1.
FIG. 2G illustrates a cross-section view of the memory device taken along a line Y2-Y2' in FIG. 1.

Please also refer to FIGS. 1 and 2F to 2G. FIG. 2F is a cross-section) the memory device 10 taken along the line Y1-Y1' in FIG. 1. FIG. 2G is a cross-section view of the memory device 10 taken along the line Y2-Y2' in FIG. 1. The memory device 10 may further include a plurality of contact members COA. The contacts COA are electrically connected to the corresponding conductive layers 102 of the array region AR in the conductive layers 102 of the staircase region SR. The contact members COA are, for example, disposed on the landing regions of the corresponding conductive layers 102 exposed in the staircase region SR. Contact members COA can also be understood as the word line contact to the array region AR. The projection areas of the contact members COA disposed in the second region R2 and the third region R3 in the first direction D1 may partially overlap the projection areas of the lower support members 205 disposed in the second region R2 and the third region R3 in the first direction D1. The projection areas of the contact members COA disposed in the first region R1 in the first direction D1 do not overlap (i.e., being separated from) the projection areas of the lower support members 205 disposed in the first region R1 in the first direction D1. That is, in the first region R1, the lower support members 205 are not provided in the lower regions of the vertical projections of the contact members COA. In one embodiment, the bottoms of the contact members COA are electrically connected to the corresponding conductive layers 102 of the conductive layers 102, and the tops of the contact member COA are electrically connected to the corresponding functional support members PIC1 by other wires. As shown in FIG. 2F, in the second region R2, the conductive layers 102 under the contact members COA can be used as a word line and a ground selection line. For example, the conductive layer 102 used as the word line may be disposed between the contact member COA and the conductive layer 102 used as the ground selection line, wherein the bottom conductive layer (i.e., the conductive layer used as the ground selection line) 102 may surround the lower support 205. As shown in FIG. 2G, in the first region R1, the conductive layer 102 disposed under the contact member COA can be used as a ground selection line.

Referring to FIGS. 3-10, FIGS. 3-10 schematically illustrate a method for manufacturing a memory device according to an embodiment of the present disclosure. FIGS. 3, 4A, 5, and 7-11 illustrate the steps of forming the cross-section taken along the line P1 in FIG. 1; FIG. 4B illustrate a step of forming the cross-section taken along the line X-X in FIG. 1; FIGS. 6A-6E illustrate the steps of forming the cross-section taken along the line X1-X1' in FIG. 1.

Figure 3:
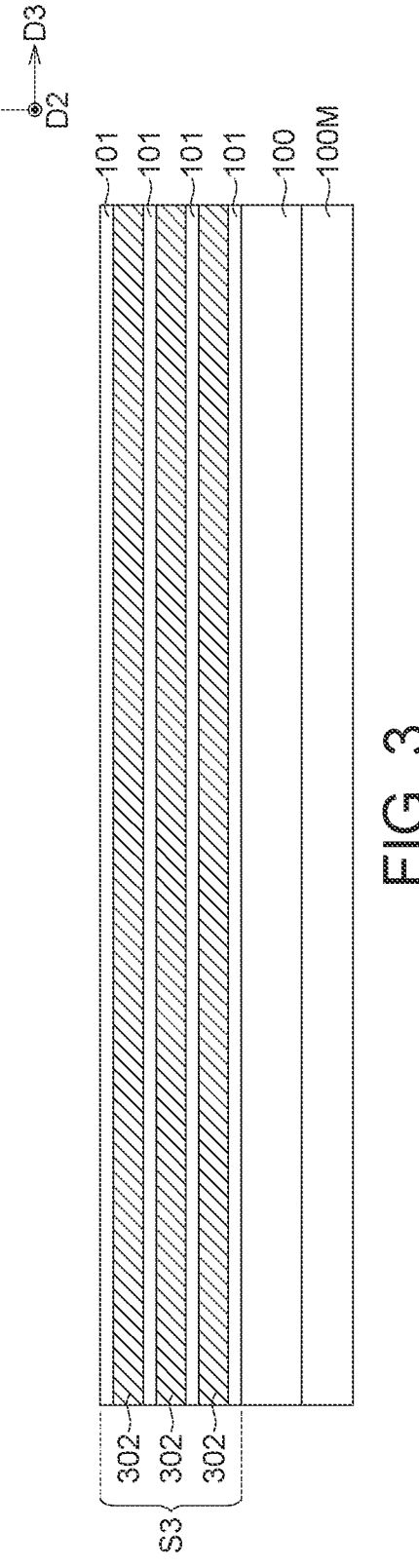
FIGS. 3-11 schematically illustrate a method for manufacturing a memory device according to an embodiment of the present disclosure.

Referring to FIG. 3, a bottom plate 100 is provided. A layer stack S3 is formed on the bottom plate 100 along the first direction D1. The layer stack S3 may include a plurality of insulating layers 101 and a plurality of dielectric layers 302 stacked alternately along the first direction D1. For example, the layer stack S3 may be formed by depositing the insulating layers 101 and the dielectric layers 302 sequentially. The bottom plate 100 may include a doped semiconductor material or an undoped semiconductor material, such as silicon. The present disclosure is not limited thereto. The insulating layer 101 may include oxide such as silicon oxide, or other suitable dielectric materials. The dielectric layer 302 may include nitride such as silicon nitride, or other suitable dielectric materials. In an embodiment, the insulating layer 101 and the dielectric layer 302 may include different materials. The layer stack S3 may include an array region AR and a staircase region SR adjacent to each other.

According to some embodiments, a circuit board 100M may be formed under the bottom plate 100. The circuit board 100M may include a control circuit MT (e.g., a CMOS logic circuit) to form a CMOS under array (CuA) architecture, but the present disclosure is not limited thereto.

Figures 4A, 4B:
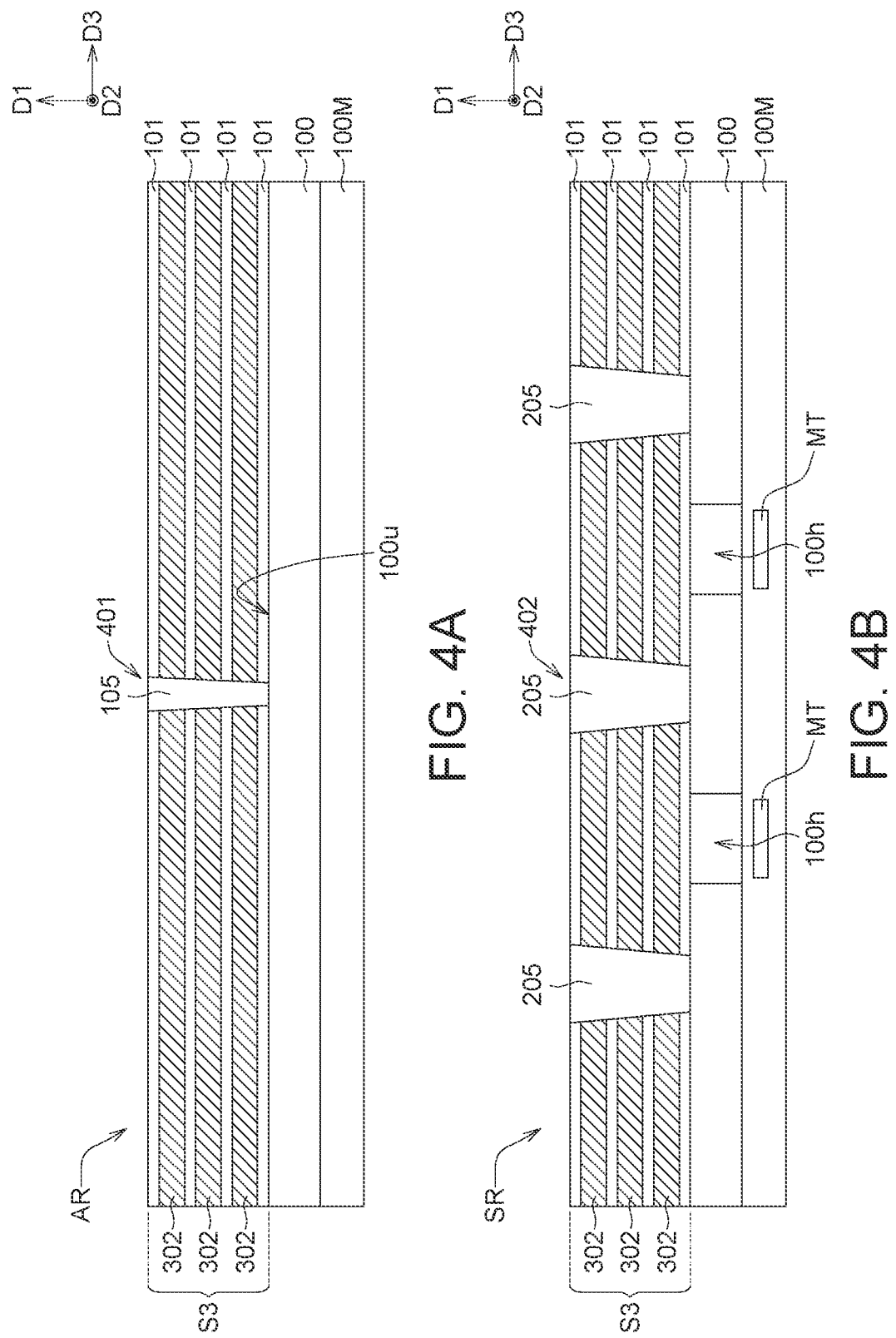

Referring to FIGS. 4A and 4B, a lower isolation structure 105 (as shown in FIG. 4A) and a lower support member 205 (as shown FIG. 4B) are formed in the layer stack S3. The lower isolation structure 105 and the lower support member 205 may extend down toward the bottom plate 100. For example, the lower isolation structure 105 and the lower support member 205 pass through the layer stack S3 along the first direction D1 and contact the bottom plate 100. The lower isolation structure 105 may extend along the first direction D1 and the second direction D2 and separate at least one insulating layer 101 and at least one dielectric layer 302 in the layer stack S3 into two parts isolated from each other. Moreover, the lower isolation structure 105 may extend from the array region AR to the staircase region SR along the second direction D2. The lower support members 205 are formed scatteredly in a plurality of predetermined positions of the staircase region SR. For example, an etching process, such as a wet etching process or a dry etching process, may be performed to the layer stack S3 to remove portions of the layer stack S3 to form trenches 401 and 402; the trenches 401 and 402 extend downwards along the first direction D1 and stops at an upper surface 100$u$ of the bottom plate 100; the trenches 401 and 402 exposes sidewalls of the layer stack S3 serving as the sidewalls of the trenches 401 and 402, and portions of the upper surface 100$u$ of the bottom plate 100 serving as the bottoms of the trenches 401 and 402; the lower isolation structure 105 may then be formed in the trench 401 by a deposition process, and the lower support members 205 may be formed in the trench 402 at the same time. The lower isolation structure 105 may include a dielectric material, such as oxide. The lower support members 205 and the lower isolation structure 105 may be formed under the same process, and the material of the lower support members 205 may be the same as that of the lower isolation structure 105. That is, the lower support members 205 may include a dielectric material such as oxide.

Figure 6A:
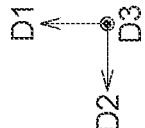

In some embodiments, before forming the layer stack S3, a plurality of holes 100$h$ passing through the bottom plate 100 may be formed in the staircase region SR, as shown in FIGS. 4B and 6A. The holes 100$h$ may correspond to a plurality of predetermined positions to form the vertical support members PIC (i.e., the functional support members PIC1) to be electrically connected to the control circuit MT in the circuit board 100M. An insulating material may be filled into the holes 100$h$.

Figure 5:
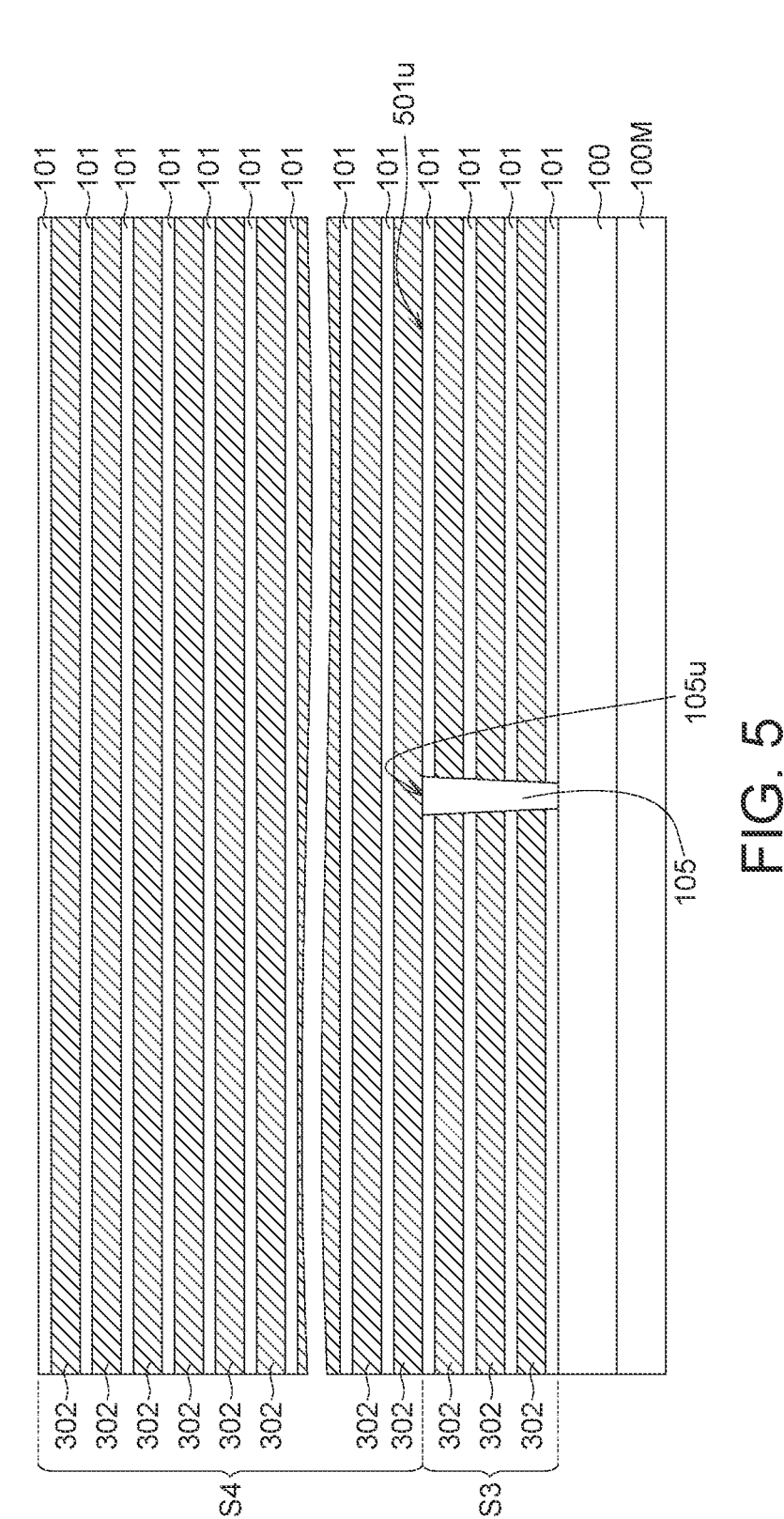

Referring to FIG. 5, an insulating stacked structure S4 is formed on the layer stack S3. The insulating stacked structure S4 may cover an upper surface 105$u$ of the lower isolation structure 105, an upper surface 105$u$ of the lower support member 205 (not shown in FIG. 5) and an upper surface 501$u$ of the layer stack S3. The lower isolation structure 105, the lower support member 205 (not shown in FIG. 5) and the layer stack S3 may be under the insulating stacked structure S4. The insulating stacked structure S4 may include insulating layers 101 and dielectric layers 302 stacked alternately along the first direction D1. For example, the insulating stacked structure S4 may be formed by depositing the insulating layers 101 and the dielectric layers 302 sequentially. In an embodiment, the number of layers of the insulating stacked structure S4 may be larger than the number of layers of the layer stack S3.

FIGS. 6A-6E illustrate some process steps performed on the staircase region SR.

Referring to FIG. 6A, after the lower support member 205 is formed in the staircase region SR and the insulating stacked structure S4 is formed, the insulating stacked structure S4 and the layer stack S3 in the staircase region SR may be patterned to form a staircase structure. Thereafter, an insulating filler 201 can be deposited on the staircase structure.

Figure 6B:
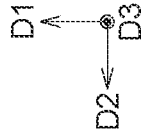

Referring to FIG. 6B, a plurality of vertical openings PICh are formed. The vertical openings PICh are disposed in the staircase region SR, and the lower support member 205 is disposed between the vertical openings PICh. The vertical openings PICh extend along the first direction D1 and pass through the corresponding layer stack S3 or/and the insulating stacked structure S4. A portion of the vertical openings PICh extend along the first direction D1, pass through the bottom plate 100 and expose the corresponding control circuit MT in the circuit board 100M for forming the subsequent functional support member PIC1; the other portions of the vertical openings PICh extend along the first direction D1, stop at the bottom plate 100 and expose the bottom plate 100, but do not pass through the bottom plate 100 for forming the subsequent dummy support member PIC2. For example, the vertical openings PICh can be formed by an etching process.

Figure 6C:
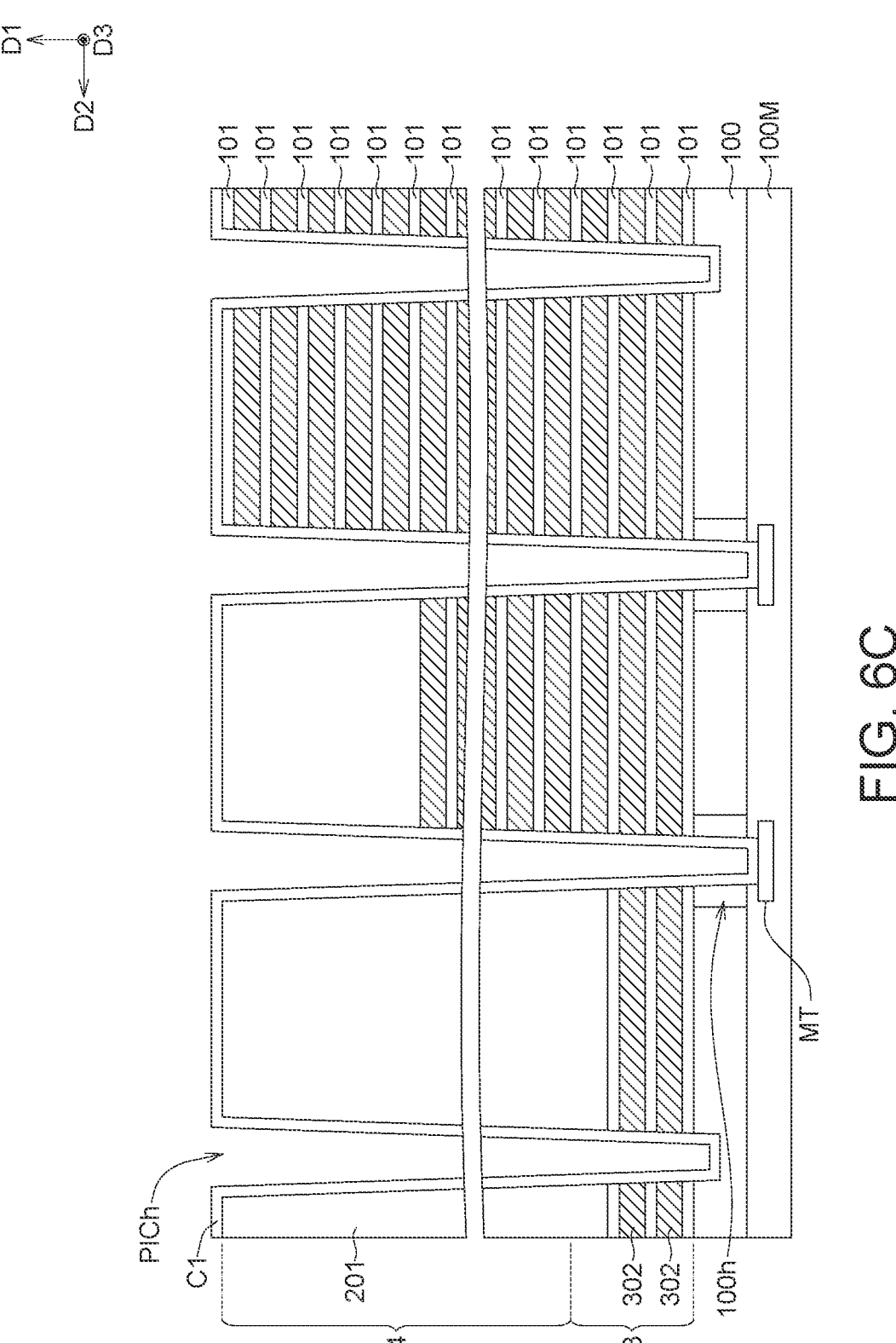
Figure 6D:
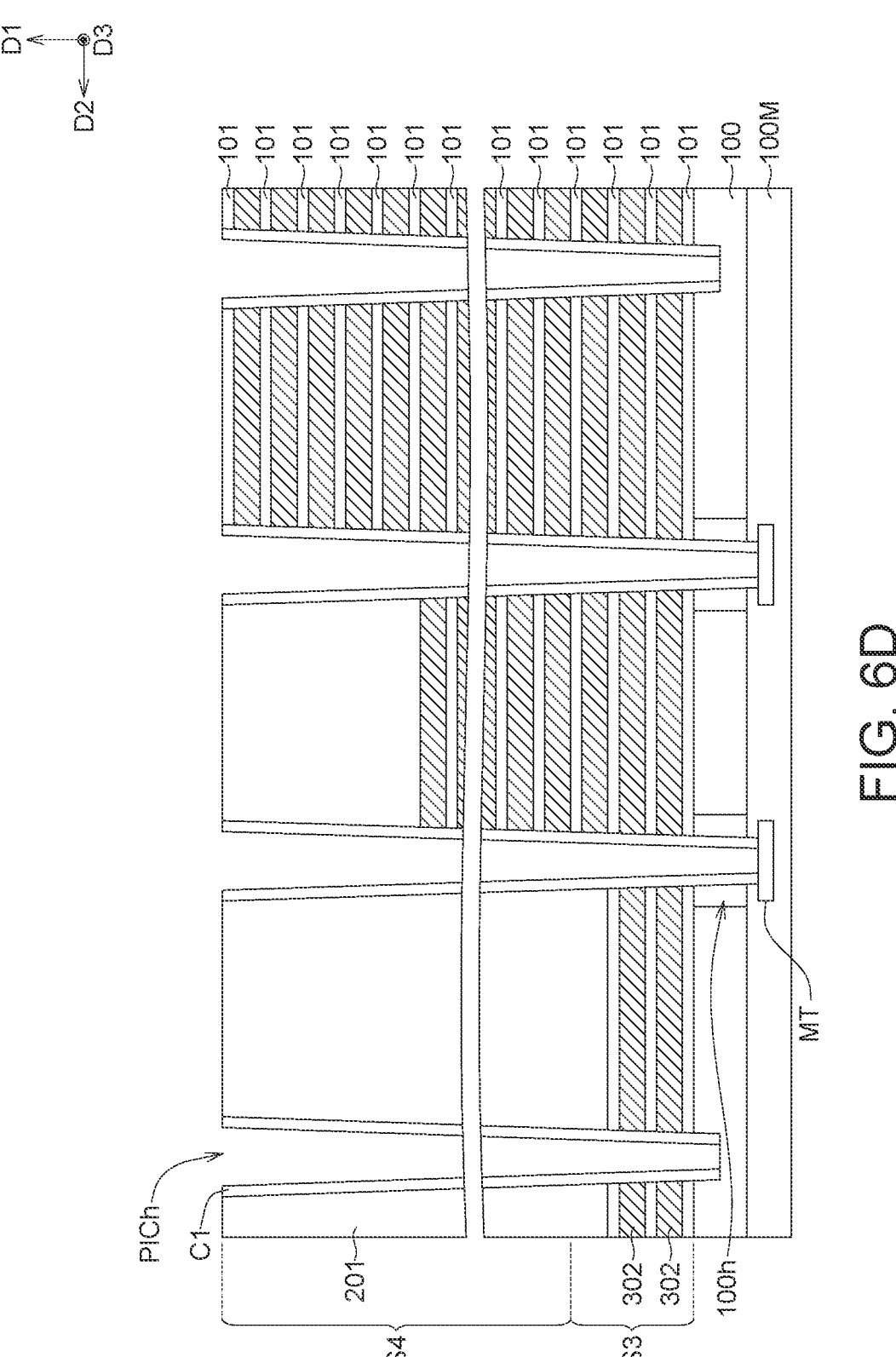

Referring to FIGS. 6C to 6D, insulating liners C1 are formed in the vertical openings PICh. For example, an insulating material may be conformally formed in the vertical openings PICh by a deposition process, as shown in FIG. 6C. After that, the insulating material outside the vertical openings PICh is removed by an etching process, and the insulating material at the bottoms of the vertical openings PICh are removed to expose the bottom plate 100 or the corresponding control circuit MT, and insulating liners C1 are formed, as shown in FIG. 6D. In the present embodiment, an material of the insulating liners C1 may include a low temperature oxide material (LTO).

Figure 6E:
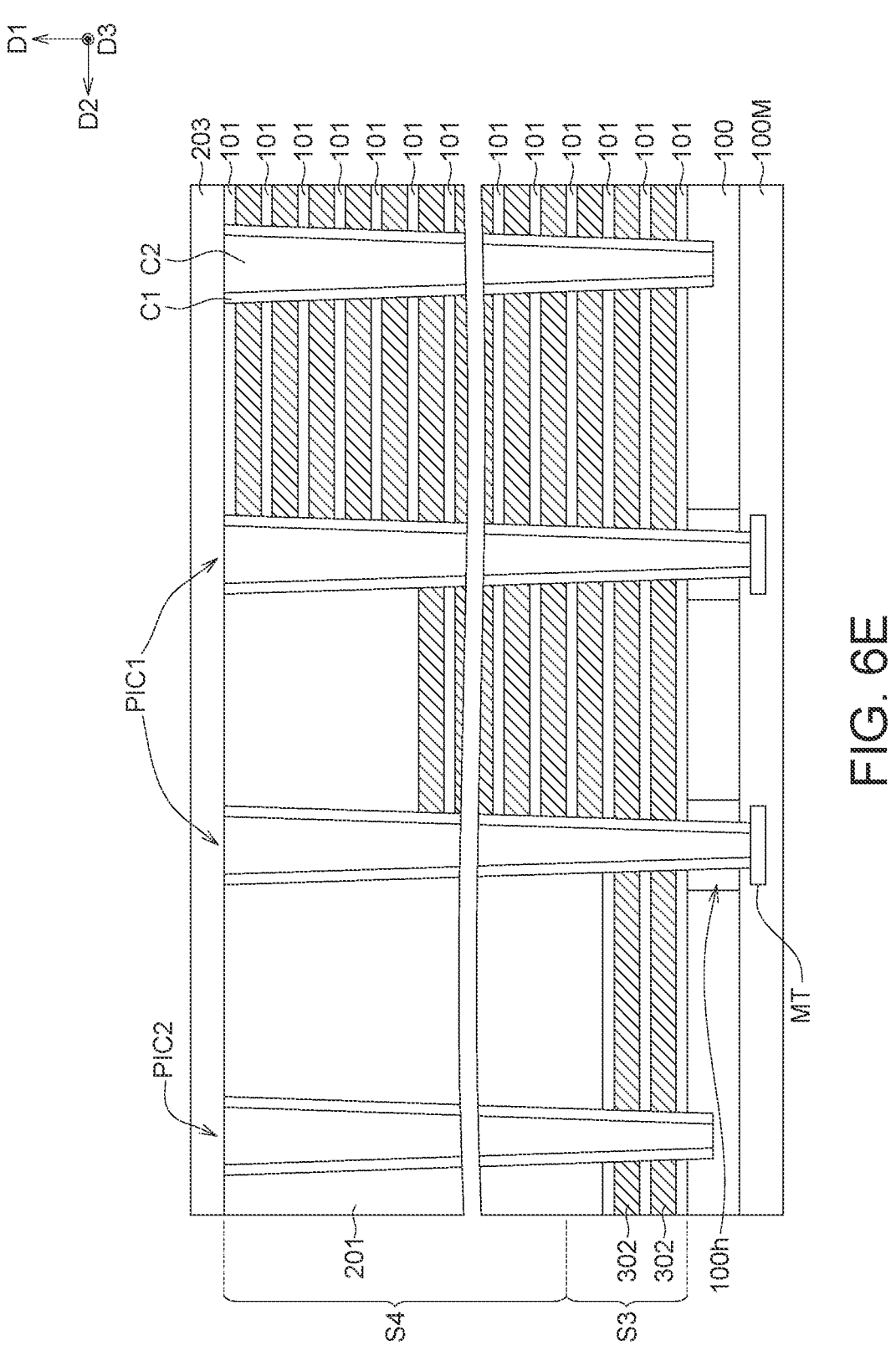

Referring to FIG. 6E, conductive pillars C2 are formed in the vertical openings PICh. For example, a conductive material can be filled in the vertical openings PICh (i.e., the spaces surrounded by the insulating liners C1) through a deposition process. In this way, the vertical support members PIC including the conductive pillars C2 and the insulating liners C1 surrounding the conductive pillars C2 are formed. The vertical support members PIC are formed in the staircase region SR, and the lower support members 205 are formed between the vertical support members PIC. The vertical support members PIC include functional support members PIC1 and dummy support members PIC2. A portion of the vertical support members PIC (i.e., the functional support members PIC1) pass through the layer stack S3 and the bottom plate 100 and are electrically connected to the corresponding control circuit MT in the circuit board 100M. Another portion of vertical support members PIC (i.e. the dummy support members PIC2) pass through the layer stack S3 and stop at the bottom plate 100. According to some embodiments, a chemical-mechanical planarization (CMP) process may be performed after the step of forming the vertical support members PIC, so that an top surface of the vertical support members PIC and a top surface of the insulating stacked structure S4 may be coplanar. Thereafter, a capping layer 203 may be formed over the vertical support members PIC and the insulating stacked structure S4, and the material of the capping layer 203 may include oxide.

Figure 7:
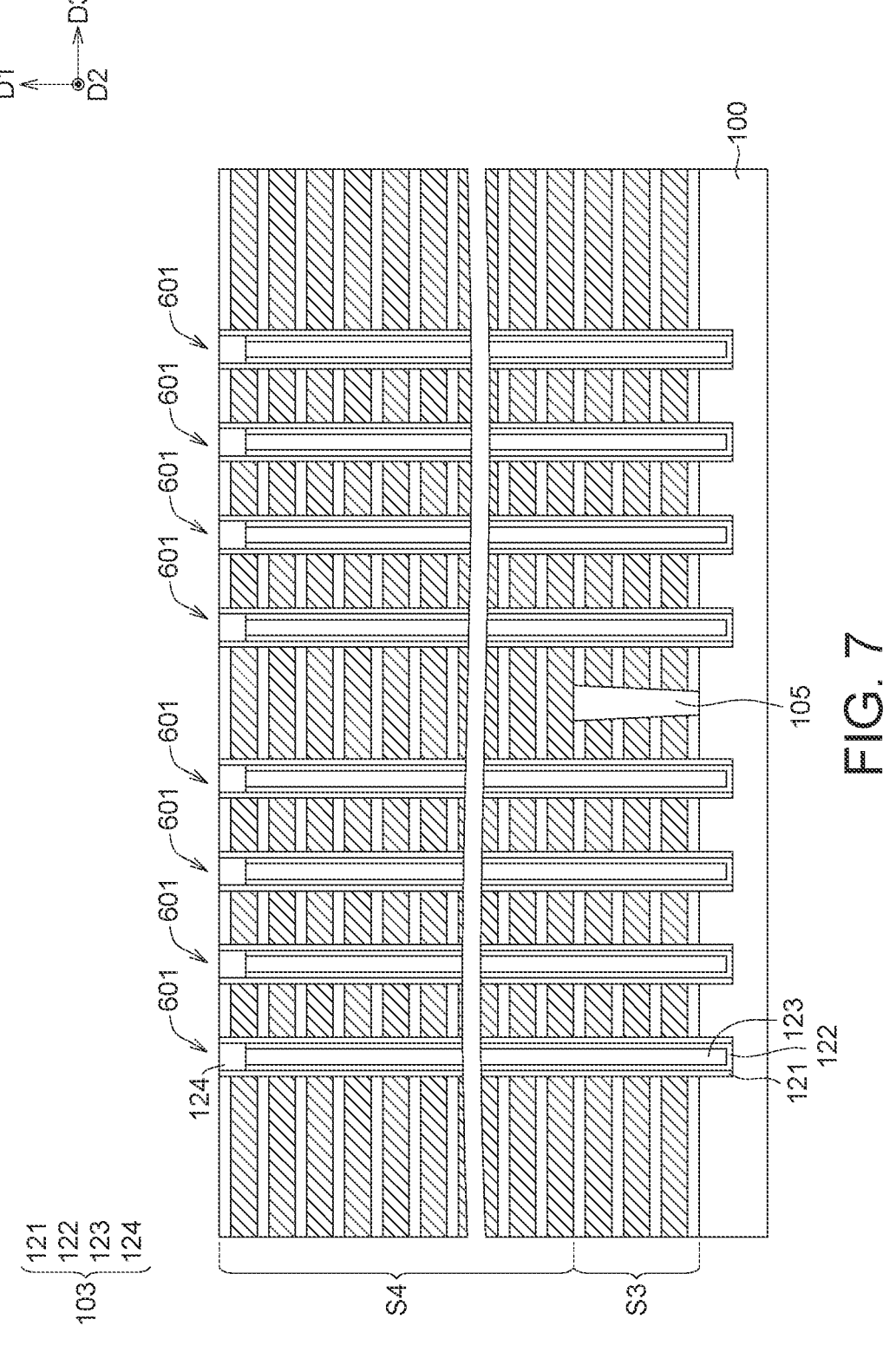

According to an embodiment, the steps as shown in FIG. 7 can be subsequent to the steps as shown in FIG. 6A. The steps as shown in FIGS. 6B-6E can be performed after the steps as shown in FIG. 7 are finished, and the steps as shown in FIGS. 8-11 can be subsequent to the steps as shown in FIG. 6E, but the present invention is not limited thereto.

Referring to FIG. 7, pillar elements 103 are formed in the array region AR after the steps as shown in FIG. 6A are finished (i.e. after forming the staircase structure). The pillar elements 103 may be arranged apart in the insulating stacked structure S4 and the layer stack S3. The pillar elements 103 may be on opposite sides of the lower isolation structure 105. The pillar element 103 may extend along the first direction D1 and pass through the insulating stacked structure S4 and the layer stack S3. In an embodiment, the formation of the pillar element 103 may include the following steps. The insulating stacked structure S4 and the layer stack S3 are patterned, such as by a photolithography process, to form holes 601 separated from each other. The hole 601 extends downwards along the first direction D1 and stops at the bottom plate 100; the hole 601 exposes sidewalls of the insulating stacked structure S4 and the layer stack S3 serving as the sidewall of the hole 601 and exposes the bottom plate 100 serving as the bottom of the hole 601. Next, a memory layer 121 may line the hole 601 by a deposition process and a bottom portion of the memory layer 121 is removed by an etching process. A channel layer 122 may be deposited on sidewalls of the memory layer 121 and contacts with the bottom plate 100 through the exposed bottom portion of the memory layer 121. An insulating pillar 123 may fill the remaining space in the hole 601 by a deposition process. Then, an etching back process and/or a chemical-mechanical planarization (CMP) process may be performed to remove part of the channel layer 122 and part of the insulating pillar 123 to expose part of the sidewall of the memory layer 121. Then, a pad 124 may be formed on the channel layer 122 and the insulating pillar 123 by a deposition process. Through the above process encompassed in FIG. 7, the pillar elements 103 are formed in the insulating stacked structure S4 and the layer stack S3.

The memory layer 121 may include a multilayer structure. For example, the memory layer 121 may include a tunnel layer on an outer sidewall of the channel layer 122, a storage layer on an outer sidewall of the tunnel layer, and a blocking layer on an outer sidewall of the storage layer. In an embodiment, the memory layer 121 may include a multilayer structure known from memory technologies, such as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), MA BE-SONOS (metal-high-k bandgap-engineered silicon-oxide-nitride-oxide-silicon), and combinations of those layers. The channel layer 122 may include a semiconductor material, such as a doped or undoped semiconductor material. In an embodiment, the channel layer 122 may include polysilicon, such as doped or undoped polysilicon. The insulating pillar 123 may include oxide such as silicon oxide, or other suitable dielectric materials. The pad 124 may include a semiconductor material, such as metal silicide, a doped or undoped semiconductor material. In an embodiment, the pad 124 may include polysilicon, such as doped or undoped polysilicon.

Figure 8:
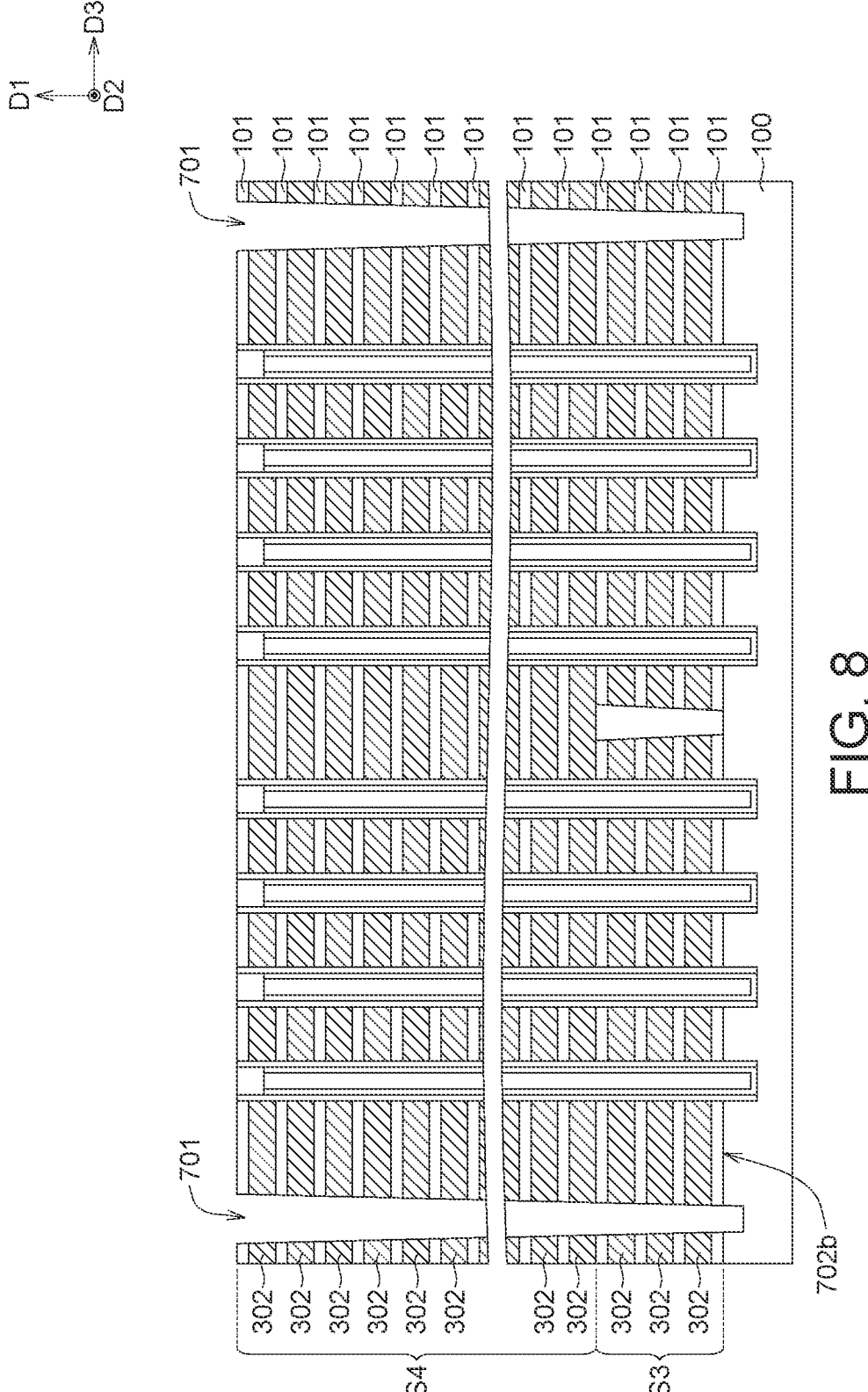

Referring to FIG. 8, slits 701 are formed in the insulating stacked structure S4 and the layer stack S3. For example, an etching process may be performed to the insulating stacked structure S4 and the layer stack S3 to remove part of the insulating stacked structure S4 and part of the layer stack S3 to form slits 701 extending along the first direction D1. The etching process for forming the slits 701 may be stopped when the etching process slightly exceeds a bottom surface 702*b* of the layer stack S3. The slit 701 exposes sidewalls of the insulating stacked structure S4 and the layer stack S3 serving as the sidewall of the slit 701 and exposes the bottom plate 100 serving as the bottom of the slit 701.

Figure 9:
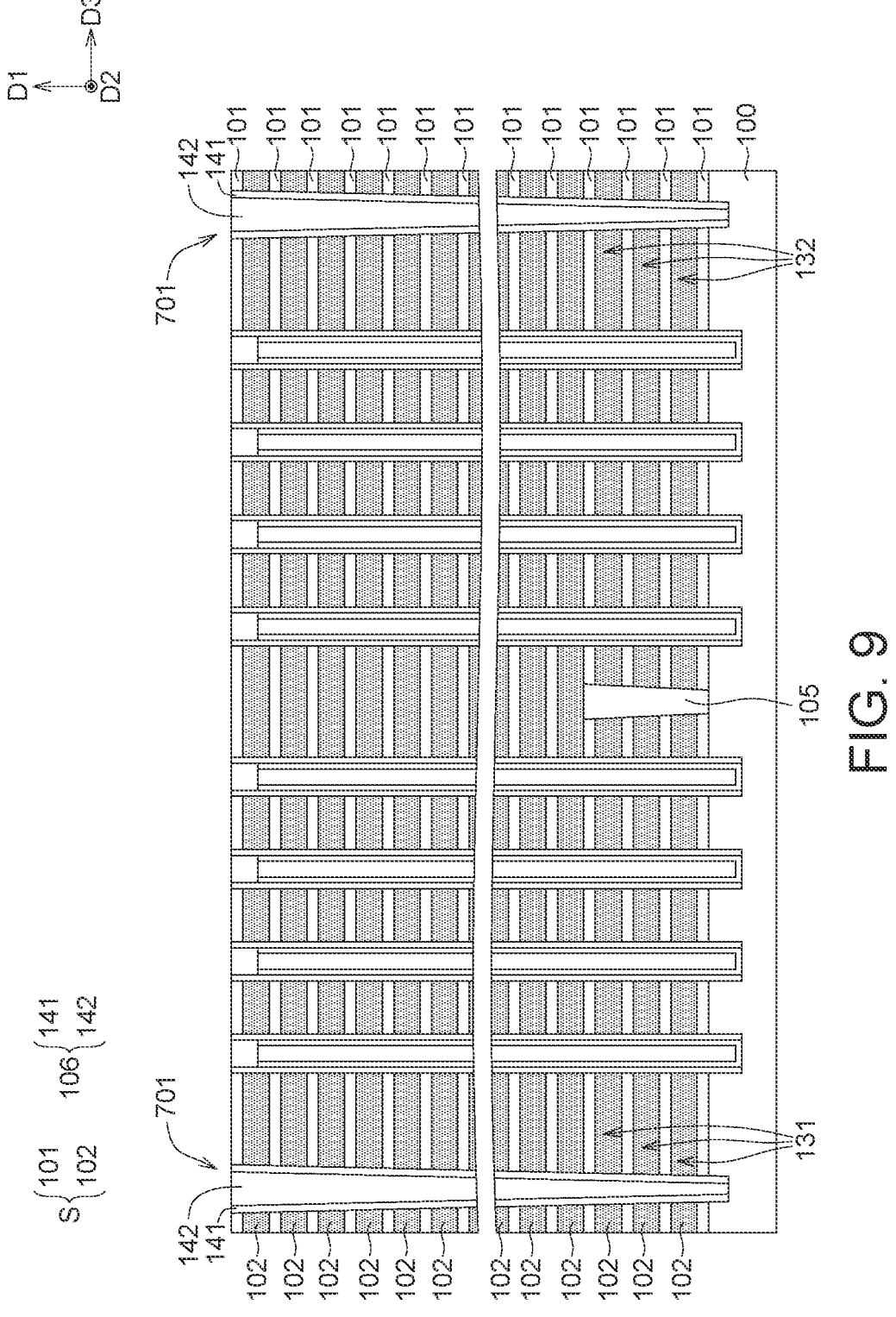

Referring to FIG. 9, the dielectric layers 302 in the insulating stacked structure S4 and the layer stack S3 are replaced by conductive layers 102. For example, an etching process may be performed to the insulating stacked structure S4 and the layer stack S3 to remove the dielectric layers 302 in the insulating stacked structure S4 and the layer stack S3 through the slits 701, and spaces between the insulating layers 101 are formed. Thereafter, isolation elements 106 are formed in the slits 701. It should be understood that, although the staircase region SR is not shown in FIG. 9, the dielectric layers 302 and the slits 701 can continuously extend from the array region AR to the staircase region SR along the second direction D2, and the dielectric layers 302 in the array region AR and the staircase region SR are all replaced with the conductive layers 102 at the same time (i.e. under the same process), as shown in FIGS. 2D to 2E.

The etching process for removing the dielectric layers 302 would not remove the lower isolation structure 105 and the lower support member 205. In order to ensure that the lower isolation structure 105 and the lower support member 205 are not removed during this etching process, the lower isolation structure 105 and the lower support member 205 may have an etching selectivity different from the etching selectivity of the dielectric layer 302; for example, in an etching process, an etching rate of the dielectric layer 302 may be larger than that of the lower isolation structure 105 and the lower support member 205; by the control of the etching time, the dielectric layer 302 is removed while the lower isolation structure 105 and the lower support member 205 are reserved.

In an embodiment, the lower isolation structure 105 separates the layer stack S3 into two parts isolated from each other, the dielectric layers 302 of the layer stack S3 on opposite sides of the lower isolation structure 105 may be removed through the slits 701 on opposite sides of the lower isolation structure 105.

Further, a conductive material fills the spaces between the insulating layers 101 to form the conductive layers 102 between the insulating layers 101 after removing the dielectric layers 302. The dielectric layers 302 on opposite sides of the lower isolation structure 105 (i.e. the dielectric layers 302 in the layer stack S3) are replaced by the conductive material so as to form the conductive layers 102, and the lower isolation structure 105 separates these conductive layers 102 into the conductive strips 131 and 132 electrically isolated from each other. The conductive layer 102 may include a conductive material such as polysilicon or metal. In an embodiment, the conductive layer 102 may include tungsten (W). In an embodiment, at least part of the conductive layers 102 above the lower isolation structure 105 may be functioned as gates. In an embodiment, the above process encompassed in FIG. 9 may be understood as a gate replacement process. After the formation of the conductive layers 102, the stacked structure S including the insulating layers 101 and the conductive layers 102 is formed.

After the formation of the conductive layers 102, isolation films 141 are formed on sidewalls of the slits 701. Then, conductive films 142 fill the remaining spaces in the slits 701. The films 141 and the conductive films 142 may be formed by deposition processes. The isolation film 141 may include a dielectric material such as silicon dioxide. The conductive film 142 may include a conductive material such as polysilicon or metal. In an embodiment, the conductive film 142 may include tungsten.

During the gate replacement process, in the staircase region SR, since the lower support members 205 and the vertical support members PIC can still provide supporting force after the spaces between the insulating layers 101 are formed, the overall structure is not easy to collapse. In particular, compared with the comparative example without the lower support members, since the of lower support members 205 of the present embodiment are arranged in the gaps between the vertical support members PIC, they can provide more sufficient supporting force, the insulating layers 101 and the subsequently formed conductive layers 102 in the replacement process corresponding to gaps between the vertical support members PIC are less prone to be deformed.

Figure 10:
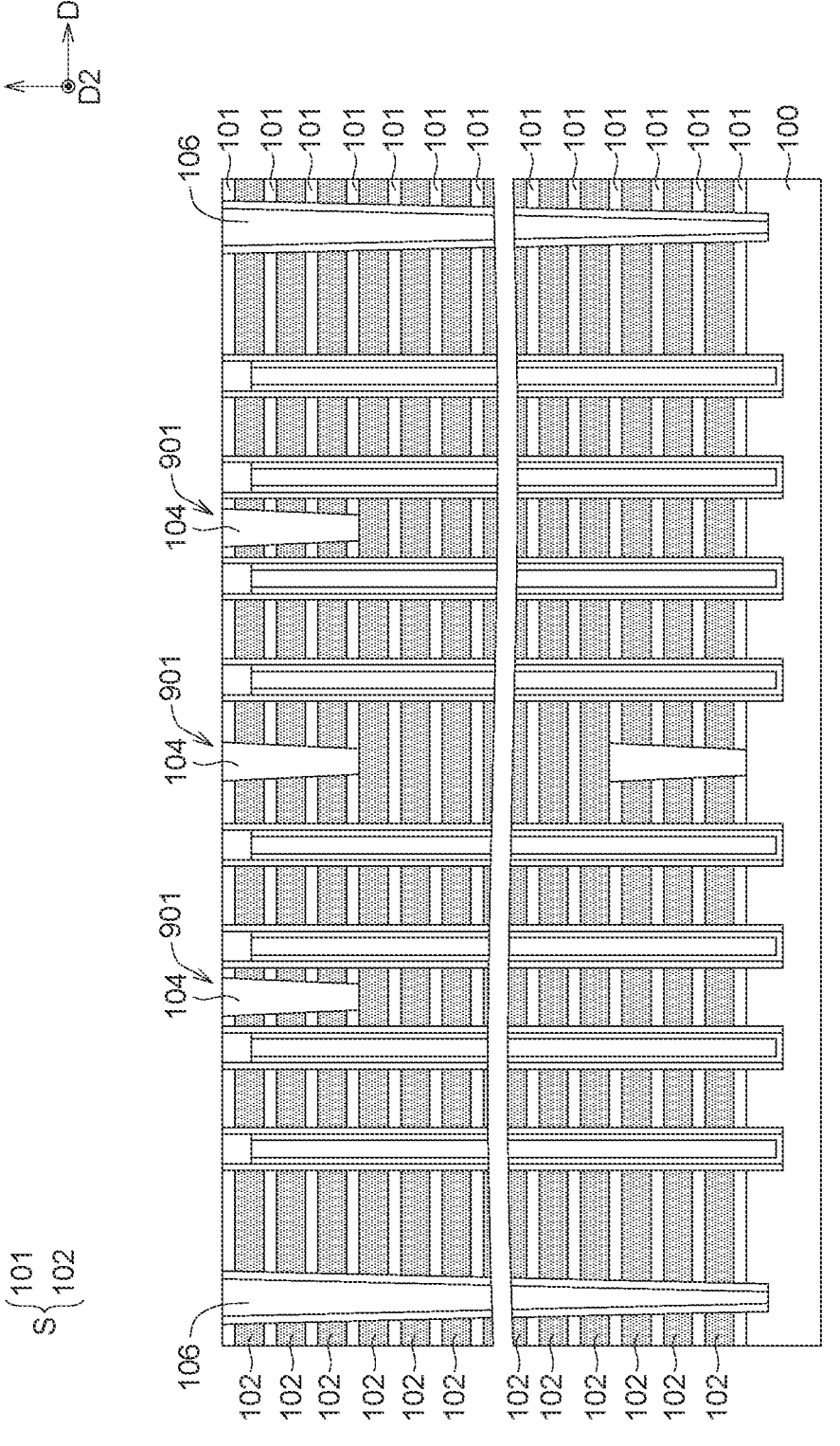

Referring to FIG. 10, upper isolation structures 104 are formed in the stacked structure S. The upper isolation structures 104 may be formed in an upper portion of the stacked structure S and pass through one or more insulating layers 101 and/or one or more conductive layers 102 of the stacked structure S. For example, an etching process may be performed to the stacked structure S to remove part of the stacked structure S to form trenches 901, and the trenches 901 may extend downwards along the first direction D1, pass through one or more conductive layers 102 (for example, 3-7 conductive layers 102) and stops at the insulating layer 101; the trench 901 exposes a portion of sidewall of the stacked structure S serving as the sidewall of the trench 901 and exposes the insulating layer 101 serving as the bottom of the trench 901; the upper isolation structures 104 are then formed in the trenches 901 by a deposition process. The upper isolation structures 104 may include oxide, or other suitable dielectric materials. In the staircase region SR, a length of the upper isolation structure 104 in the second direction D2 is smaller than a length of the lower isolation structure 105 in the second direction D2, as shown in FIG. 1.

Figure 11:
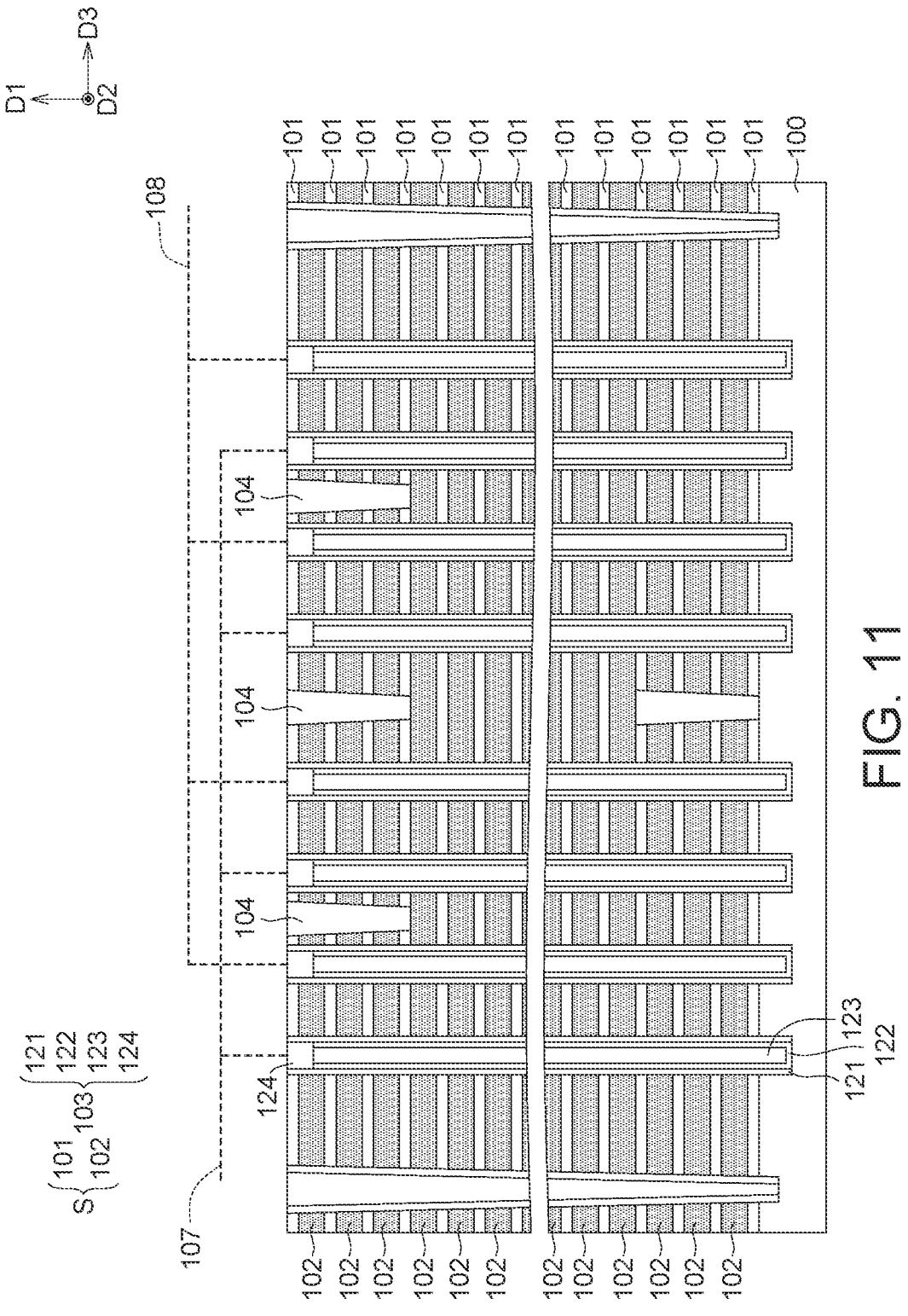

Referring to FIG. 11, at least one first upper conductive structure 107 and at least one second upper conductive structure 108 are formed above the stacked structure S. The first upper conductive structure 107 and the second upper conductive structure 108 may extend along the third direction D3 and be disposed alternately above the stacked structure S. The first upper conductive structure 107 and the second upper conductive structure 108 may include conductive materials such as metal.

In an embodiment, the above manufacturing method may further include formation of tubular elements 109. The formation of tubular elements 109 is exemplarily described below (not shown). In the process encompassed in FIG. 7, more pillar elements 103 are formed, wherein some of the pillar elements 103 may be processed in the process encompassed in FIG. 10 to form the tubular elements 109. The pillar elements 103 used to form the tubular elements 109 may be formed at the location where the upper isolation structure 104 is intended to be formed. In the process encompassed in FIG. 10, the formation of the upper isolation structures 104 may include: performing an etching process to the pillar elements 103 used to form the tubular elements 109 to remove upper portions of the pillar elements 103 to form the tubular elements 109, and performing a deposition process to form upper isolation structures 104 on the tubular elements 109. The memory layer 151 of the tubular elements 109 and the memory layer 121 of the pillar element 103 may include similar materials. The dummy channel layer 152 of the tubular elements 109 and the channel layer 122 of the pillar element 103 may include similar materials. The insulating pillar 153 of the tubular elements 109 and the insulating pillar 123 of the pillar element 103 may include similar materials.

In an embodiment, through the method schematically illustrated in FIGS. 3-11, a memory device 10 shown in FIGS. 1, 2A-2B and 4D-2H is provided.

As shown in FIGS. 1A, 1B, 2A and 2B, the memory device 10 includes three upper isolation structures 104 and a lower isolation structure 105 between two isolation elements 106. The present disclosure is not limited thereto. The present disclosure can be applied to the memory device including more or less upper isolation structures and/or lower isolation structures and/or pillar elements. Similarly, the number of the lower support members 205 in the present disclosure is not limited to the number shown in FIG. 1, but can be applied to a memory device including more or less lower support members.

The present disclosure provides memory devices including lower support members. Since the lower support members are arranged in the staircase region of the memory device, the lower support members can be distributed in the gaps between the vertical support members, so compared with the comparative example without the lower support members, more supporting force can be provided, The deformation or collapse of the insulating layers and the conductive layers can be further prevented, so the yield of the process can be improved. In addition, since the lower support members and the lower isolation structure can be formed under the same process, no additional process steps are required to improve the supporting force, which saves time and cost.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a memory device, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:

a stacked structure comprising conductive layers, wherein the stacked structure has an array region and a staircase region adjacent to the array region;

a lower isolation structure in the stacked structure and having an upper surface in a lower portion of the stacked structure, wherein the lower isolation structure extends from the array region to the staircase region, and the lower isolation structure separates at least one conductive layer of the conductive layers disposed in the lower portion of the stacked structure into a first conductive strip and a second conductive strip, the first conductive strip and the second conductive strip are electrically isolated from each other, two memory strings in the array region of the stacked structure and electrically connected to the first conductive strip and the second conductive strip respectively; and at least one lower support member in the staircase region of the stacked structure, a material of the at least one lower support member is the same as a material of the lower isolation structure, and a height of the at least one lower support member is the same as a height of the lower isolation structure.

2. The memory device according to claim 1, further comprising:

a bottom plate, the stacked structure disposed over the bottom plate;

a circuit board disposed under the bottom plate; and a plurality of vertical support members disposed in the staircase region and passing through the stacked structure, and a portion of the vertical support members passing through the bottom plate and electrically connected to corresponding control circuits in the circuit board to form a plurality of functional support members; another portion of the vertical support members having bottoms stopping at the bottom plate to form a plurality of dummy support members.

3. The memory device according to claim 2, wherein a number of the at least one lower support member is plural, and the lower support members are disposed between the vertical support members.

4. The memory device according to claim 2, further comprising a plurality of contact members disposed in the staircase region, bottoms of the contact members are electrically connected to corresponding conductive layers in the conductive layers, and tops of the contact members are electrically connected to corresponding functional support members in the functional support members.

5. The memory device according to claim 2, wherein the dummy support members are electrically floating.

6. The memory device according to claim 1, further comprising an upper isolation structure in the stacked structure, wherein the upper isolation structure extends along a first direction and separates at least one conductive layer disposed in an upper portion of the stacked structure, the upper isolation structure at least partially overlaps the lower isolation structure in the first direction.

7. The memory device according to claim 6, wherein the staircase region comprises a first region, a second region and a third region, the second region is disposed between the first region and the third region, and the third region is closer to the array region in comparison with the first region;

wherein the upper isolation structure extends from the array region along a second direction different from the first direction, passes through the third region of the staircase region, and stops at the second region of the staircase region.

8. The memory device according to claim 7, further comprising a plurality of contact members disposed in the staircase region, the contact members are electrically connected to corresponding conductive layers in the conductive layers, wherein a number of the at least one lower support member is plural, projection areas of the contact members disposed in the second region and the third region in the first direction are partially overlapped with projection areas of the lower support members disposed in the second region and the third region in the first direction; projection areas of the contact members disposed in the first region in the first direction is separated from projection areas of the lower support members disposed in the first region in the first direction.

9. The memory device according to claim 7, wherein the lower isolation structure extends from the array region and passes through the third region, the second region and the first region of the staircase region along the second direction.

10. The memory device according to claim 1, further comprising a first channel layer and a second channel layer disposed in the array region, wherein the first channel layer and the second channel layer have tubular shapes and pass through the stacked structure, the first channel layer and the second channel layer are disposed on opposite sides of the lower isolation structure, one of the two memory strings electrically connected to the first conductive strip is electrically connected to the first channel layer, another one of the two of memory strings electrically connected to the second conductive strip is electrically connected to the second channel layer.

11. The memory device according to claim 1, wherein the lower isolation structure separates at least three conductive layers of the conductive layers.

12. The memory device according to claim 1, wherein the lower isolation structure and the lower support members comprise a dielectric material.

13. The memory device according to claim 1, wherein a top surface of the lower support member and a top surface of the lower isolation structure are coplanar.

* * * * *